United States Patent
Uzoh

(10) Patent No.: US 9,633,971 B2
(45) Date of Patent: Apr. 25, 2017

(54) STRUCTURES AND METHODS FOR LOW TEMPERATURE BONDING USING NANOPARTICLES

(71) Applicant: Invensas Corporation, San Jose, CA (US)

(72) Inventor: Cyprian Emeka Uzoh, San Jose, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 14/796,381

(22) Filed: Jul. 10, 2015

(65) Prior Publication Data

US 2017/0012021 A1  Jan. 12, 2017

(51) Int. Cl.
   *H01L 23/00* (2006.01)
   *H01L 25/065* (2006.01)
   *H01L 25/00* (2006.01)

(52) U.S. Cl.
   CPC .......... *H01L 24/83* (2013.01); *H01L 25/0657* (2013.01); *H01L 25/50* (2013.01); *H01L 2224/83815* (2013.01); *H01L 2924/014* (2013.01); *H01L 2924/0105* (2013.01); *H01L 2924/01013* (2013.01);
   (Continued)

(58) Field of Classification Search
   CPC ...... H01L 24/83; H01L 25/0657; H01L 25/50
   See application file for complete search history.

(56) References Cited

U.S. PATENT DOCUMENTS 3,214,827 A 11/1965 Phohofsky
3,766,439 A 10/1973 Isaacson
(Continued)

FOREIGN PATENT DOCUMENTS

CN 1244037 2/2000
DE 102006006825 A1 8/2007
(Continued)

OTHER PUBLICATIONS

Milan Paunovic, Mordechay Schlesinger, Dexter D. Snyder; Modern Elecroplating, Fifth Edition; 2010 Wiley & Sons; pp. 1-32.*
(Continued)

*Primary Examiner* — Minh-Loan Tran
*Assistant Examiner* — Farid Khan
(74) *Attorney, Agent, or Firm* — Lerner, David, Littenberg, Krumholz & Mentlik, LLP

(57) ABSTRACT

A method of making an assembly can include forming a first conductive element at a first surface of a substrate of a first component, forming conductive nanoparticles at a surface of the conductive element by exposure to an electroless plating bath, juxtaposing the surface of the first conductive element with a corresponding surface of a second conductive element at a major surface of a substrate of a second component, and elevating a temperature at least at interfaces of the juxtaposed first and second conductive elements to a joining temperature at which the conductive nanoparticles cause metallurgical joints to form between the juxtaposed first and second conductive elements. The conductive nanoparticles can be disposed between the surfaces of the first and second conductive elements. The conductive nanoparticles can have long dimensions smaller than 100 nanometers.

12 Claims, 5 Drawing Sheets

(52) U.S. Cl.
CPC .............. *H01L 2924/01028* (2013.01); *H01L 2924/01029* (2013.01); *H01L 2924/01047* (2013.01); *H01L 2924/01079* (2013.01); *H01L 2924/3841* (2013.01)

(56) References Cited

U.S. PATENT DOCUMENTS

| | | |
|---|---|---|
| 3,775,844 A | 12/1973 | Parks |
| 3,873,889 A | 3/1975 | Leyba |
| 4,225,900 A | 9/1980 | Ciccio et al. |
| 4,567,543 A | 1/1986 | Miniet |
| 4,576,543 A | 3/1986 | Kuchyt et al. |
| 4,695,870 A | 9/1987 | Patraw |
| 4,716,049 A | 12/1987 | Patraw |
| 4,781,601 A | 11/1988 | Kuhl et al. |
| 4,804,132 A | 2/1989 | DiFrancesco |
| 4,902,600 A | 2/1990 | Tamagawa et al. |
| 4,924,353 A | 5/1990 | Patraw |
| 4,941,033 A | 7/1990 | Kishida |
| 4,975,079 A | 12/1990 | Beaman et al. |
| 4,982,265 A | 1/1991 | Watanabe et al. |
| 4,991,290 A | 2/1991 | MacKay |
| 5,046,238 A | 9/1991 | Daigle et al. |
| 5,068,714 A | 11/1991 | Seipler |
| 5,083,697 A | 1/1992 | Difrancesco |
| 5,116,456 A | 5/1992 | Nestor |
| 5,116,459 A | 5/1992 | Kordus et al. |
| 5,117,282 A | 5/1992 | Salatino |
| 5,130,779 A | 7/1992 | Agarwala et al. |
| 5,138,438 A | 8/1992 | Masayuki et al. |
| 5,148,265 A | 9/1992 | Khandros et al. |
| 5,148,266 A | 9/1992 | Khandros et al. |
| 5,172,303 A | 12/1992 | Bernardoni et al. |
| 5,189,505 A | 2/1993 | Bartelink |
| 5,196,726 A | 3/1993 | Nishiguchi et al. |
| 5,198,888 A | 3/1993 | Sugano et al. |
| 5,214,308 A | 5/1993 | Nishiguchi et al. |
| 5,220,448 A | 6/1993 | Vogel et al. |
| 5,220,488 A | 6/1993 | Denes |
| 5,222,014 A | 6/1993 | Lin |
| 5,224,023 A | 6/1993 | Smith et al. |
| 5,247,423 A | 9/1993 | Lin et al. |
| 5,251,806 A | 10/1993 | Agarwala et al. |
| 5,281,852 A | 1/1994 | Normington |
| 5,313,416 A | 5/1994 | Kimura |
| 5,324,892 A | 6/1994 | Granier et al. |
| 5,334,804 A | 8/1994 | Love et al. |
| 5,334,875 A | 8/1994 | Sugano et al. |
| 5,345,205 A | 9/1994 | Kornrumpf |
| 5,347,159 A | 9/1994 | Khandros et al. |
| 5,390,844 A | 2/1995 | DiStefano et al. |
| 5,394,303 A | 2/1995 | Yamaji |
| 5,397,916 A | 3/1995 | Normington |
| 5,397,997 A | 3/1995 | Tuckerman et al. |
| 5,398,863 A | 3/1995 | Grube et al. |
| 5,409,865 A | 4/1995 | Karnezos |
| 5,422,435 A | 6/1995 | Takiar et al. |
| 5,426,563 A | 6/1995 | Moresco et al. |
| 5,440,171 A | 8/1995 | Miyano et al. |
| 5,448,511 A | 9/1995 | Paurus et al. |
| 5,454,160 A | 10/1995 | Nickel |
| 5,455,390 A | 10/1995 | DiStefano et al. |
| 5,455,740 A | 10/1995 | Burns |
| 5,457,879 A | 10/1995 | Gurtler et al. |
| 5,466,635 A | 11/1995 | Lynch et al. |
| 5,479,318 A | 12/1995 | Burns |
| 5,489,749 A | 2/1996 | DiStefano |
| 5,491,302 A | 2/1996 | DiStefano et al. |
| 5,518,964 A | 5/1996 | DiStefano et al. |
| 5,536,909 A | 7/1996 | DiStefano et al. |
| 5,539,153 A | 7/1996 | Schwiebert et al. |
| 5,541,525 A | 7/1996 | Wood et al. |
| 5,552,963 A | 9/1996 | Burns |
| 5,587,342 A | 12/1996 | Lin et al. |
| 5,615,824 A | 4/1997 | Fjelstad et al. |
| 5,640,052 A | 6/1997 | Tsukamoto |
| 5,646,446 A | 7/1997 | Nicewarner, Jr. et al. |
| 5,656,550 A | 8/1997 | Tsuji et al. |
| 5,659,952 A | 8/1997 | Kovac et al. |
| 5,679,977 A | 10/1997 | Khandros et al. |
| 5,689,091 A | 11/1997 | Hamzehdoost et al. |
| 5,717,556 A | 2/1998 | Yanagida |
| 5,731,709 A | 3/1998 | Pastore et al. |
| 5,739,585 A | 4/1998 | Akram et al. |
| 5,762,845 A | 6/1998 | Crumly |
| 5,776,797 A | 7/1998 | Nicewarner, Jr. et al. |
| 5,777,386 A | 7/1998 | Higashi et al. |
| 5,786,271 A | 7/1998 | Ohida et al. |
| 5,789,279 A | 8/1998 | Crema |
| 5,789,815 A | 8/1998 | Tessier et al. |
| 5,798,286 A | 8/1998 | Faraci et al. |
| 5,802,699 A | 9/1998 | Fjelstad et al. |
| 5,805,422 A | 9/1998 | Otake et al. |
| 5,811,982 A | 9/1998 | Beaman et al. |
| 5,854,507 A | 12/1998 | Miremadi et al. |
| 5,861,666 A | 1/1999 | Bellaar |
| 5,956,234 A | 9/1999 | Mueller |
| 5,973,391 A | 10/1999 | Bischoff et al. |
| 5,980,270 A | 11/1999 | Fjelstad et al. |
| 5,985,692 A | 11/1999 | Poenisch et al. |
| 6,001,671 A | 12/1999 | Fjelstad |
| 6,032,359 A | 3/2000 | Carroll |
| 6,052,287 A | 4/2000 | Palmer et al. |
| 6,054,756 A | 4/2000 | DiStefano et al. |
| 6,059,984 A | 5/2000 | Cohen et al. |
| 6,061,245 A | 5/2000 | Ingraham et al. |
| 6,157,075 A | 12/2000 | Karavakis et al. |
| 6,175,159 B1 | 1/2001 | Sasaki et al. |
| 6,177,636 B1 | 1/2001 | Fjelstad |
| 6,202,297 B1 | 3/2001 | Faraci et al. |
| 6,216,941 B1 | 4/2001 | Yokoyama et al. |
| 6,217,972 B1 | 4/2001 | Beroz et al. |
| 6,218,302 B1 | 4/2001 | Braeckelmann et al. |
| 6,229,220 B1 | 5/2001 | Saitoh et al. |
| 6,235,996 B1 | 5/2001 | Farooq et al. |
| 6,258,625 B1 | 7/2001 | Brofman et al. |
| 6,300,679 B1 | 10/2001 | Mukerji et al. |
| 6,307,260 B1 | 10/2001 | Smith et al. |
| 6,322,903 B1 | 11/2001 | Siniaguine et al. |
| 6,329,594 B1 | 12/2001 | Sturcken |
| 6,332,270 B2 | 12/2001 | Beaman et al. |
| 6,335,571 B1 | 1/2002 | Capote et al. |
| 6,358,627 B2 | 3/2002 | Benenati et al. |
| 6,362,525 B1 | 3/2002 | Rahim |
| 6,455,785 B1 | 9/2002 | Sakurai et al. |
| 6,458,411 B1 | 10/2002 | Goossen et al. |
| 6,469,394 B1 | 10/2002 | Wong et al. |
| 6,495,914 B1 | 12/2002 | Sekine et al. |
| 6,514,847 B1 | 2/2003 | Ohsawa et al. |
| 6,515,355 B1 | 2/2003 | Yin et al. |
| 6,522,018 B1 | 2/2003 | Tay et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,578,754 B1 | 6/2003 | Tung |
| 6,589,870 B1 | 7/2003 | Katoh et al. |
| 6,592,109 B2 | 7/2003 | Yamaguchi et al. |
| 6,624,653 B1 | 9/2003 | Cram |
| 6,647,310 B1 | 11/2003 | Yi et al. |
| 6,648,213 B1 | 11/2003 | Patterson et al. |
| 6,664,637 B2 | 12/2003 | Jimarez et al. |
| 6,681,982 B2 | 1/2004 | Tung |
| 6,734,539 B2 | 5/2004 | Degani et al. |
| 6,734,556 B2 | 5/2004 | Shibata |
| 6,767,819 B2 | 7/2004 | Lutz |
| 6,782,610 B1 | 8/2004 | Iijima et al. |
| 6,815,252 B2 | 11/2004 | Pendse |
| 6,822,336 B2 | 11/2004 | Kurita |
| 6,852,564 B2 | 2/2005 | Ohuchi et al. |
| 6,869,750 B2 | 3/2005 | Zhang et al. |
| 6,870,274 B2 | 3/2005 | Huang et al. |
| 6,875,638 B2 | 4/2005 | Yoneda et al. |
| 6,888,255 B2 | 5/2005 | Murtuza et al. |

(56) References Cited

U.S. PATENT DOCUMENTS

| | | |
|---|---|---|
| 6,902,869 B2 | 6/2005 | Appelt et al. |
| 6,906,418 B2 | 6/2005 | Hiatt et al. |
| 6,956,165 B1 | 10/2005 | Hata et al. |
| 6,965,166 B2 | 11/2005 | Hikita et al. |
| 6,992,379 B2 | 1/2006 | Alcoe et al. |
| 6,995,044 B2 | 2/2006 | Yoneda et al. |
| 6,995,469 B2 | 2/2006 | Hatakeyama |
| 7,043,831 B1 | 5/2006 | Farnworth et al. |
| 7,115,495 B2 | 10/2006 | Wark et al. |
| 7,125,789 B2 | 10/2006 | Tellkamp et al. |
| 7,176,043 B2 | 2/2007 | Haba et al. |
| 7,183,190 B2 | 2/2007 | Saijo et al. |
| 7,214,887 B2 | 5/2007 | Higashida et al. |
| 7,361,285 B2 | 4/2008 | Kim |
| 7,382,049 B2 | 6/2008 | Ho et al. |
| 7,449,099 B1* | 11/2008 | Mayer .................... H05K 3/243 205/122 |
| 7,569,935 B1* | 8/2009 | Fan ........................ H01L 24/16 257/737 |
| 7,598,613 B2 | 10/2009 | Tanida et al. |
| 7,745,943 B2 | 6/2010 | Haba et al. |
| 7,829,265 B2 | 11/2010 | Kitada et al. |
| 7,901,989 B2 | 3/2011 | Haba et al. |
| 7,911,805 B2 | 3/2011 | Haba |
| 8,115,310 B2 | 2/2012 | Masumoto et al. |
| 8,330,272 B2 | 12/2012 | Haba |
| 2001/0008309 A1 | 7/2001 | Iijima et al. |
| 2001/0030061 A1 | 10/2001 | Yoneda |
| 2002/0033412 A1 | 3/2002 | Tung |
| 2002/0056906 A1 | 5/2002 | Kajiwara et al. |
| 2002/0074641 A1 | 6/2002 | Towle et al. |
| 2002/0090756 A1 | 7/2002 | Tago et al. |
| 2002/0125571 A1 | 9/2002 | Corisis et al. |
| 2002/0153602 A1 | 10/2002 | Tay et al. |
| 2002/0155661 A1 | 10/2002 | Massingill et al. |
| 2002/0185735 A1 | 12/2002 | Sakurai et al. |
| 2002/0190107 A1 | 12/2002 | Shah et al. |
| 2003/0001286 A1 | 1/2003 | Kajiwara et al. |
| 2003/0019568 A1 | 1/2003 | Liu et al. |
| 2003/0075791 A1 | 4/2003 | Shibata |
| 2003/0082846 A1 | 5/2003 | Yoneda et al. |
| 2003/0094700 A1 | 5/2003 | Aiba et al. |
| 2003/0107118 A1 | 6/2003 | Pflughaupt et al. |
| 2003/0127734 A1 | 7/2003 | Lee et al. |
| 2003/0132518 A1 | 7/2003 | Castro |
| 2003/0164540 A1 | 9/2003 | Lee et al. |
| 2003/0189260 A1 | 10/2003 | Tong et al. |
| 2003/0234453 A1 | 12/2003 | Liu et al. |
| 2004/0031972 A1 | 2/2004 | Pflughaupt et al. |
| 2004/0087057 A1 | 5/2004 | Wang et al. |
| 2004/0126927 A1 | 7/2004 | Lin et al. |
| 2004/0132533 A1 | 7/2004 | Leifer |
| 2004/0135243 A1 | 7/2004 | Aoyagi |
| 2004/0155358 A1 | 8/2004 | Iijima |
| 2004/0173900 A1* | 9/2004 | Chen .................... H01L 21/288 257/734 |
| 2004/0201096 A1 | 10/2004 | Iijima et al. |
| 2004/0232533 A1 | 11/2004 | Hatakeyama |
| 2004/0238936 A1 | 12/2004 | Rumer et al. |
| 2004/0245213 A1 | 12/2004 | Fukase et al. |
| 2004/0262778 A1 | 12/2004 | Hua |
| 2005/0097727 A1 | 5/2005 | Iijima et al. |
| 2005/0101136 A1 | 5/2005 | Mori |
| 2005/0116326 A1 | 6/2005 | Haba et al. |
| 2005/0124091 A1 | 6/2005 | Fukase et al. |
| 2005/0150684 A1* | 7/2005 | Hashimoto ............ B82Y 30/00 174/256 |
| 2005/0194695 A1 | 9/2005 | Lin et al. |
| 2005/0284658 A1 | 12/2005 | Kubota et al. |
| 2005/0285246 A1 | 12/2005 | Haba et al. |
| 2006/0091538 A1 | 5/2006 | Kabadi |
| 2006/0138647 A1 | 6/2006 | Crisp et al. |
| 2006/0220259 A1 | 10/2006 | Chen et al. |
| 2006/0254502 A1 | 11/2006 | Garrou et al. |
| 2007/0017090 A1 | 1/2007 | Sakai et al. |
| 2007/0045869 A1 | 3/2007 | Ho et al. |
| 2007/0141750 A1 | 6/2007 | Iwasaki et al. |
| 2007/0164447 A1 | 7/2007 | Ho et al. |
| 2007/0209199 A1 | 9/2007 | Iijima et al. |
| 2007/0230153 A1 | 10/2007 | Tanida et al. |
| 2008/0003402 A1 | 1/2008 | Haba et al. |
| 2008/0067661 A1 | 3/2008 | Kawabata |
| 2008/0145607 A1* | 6/2008 | Kajiwara .............. H01L 21/563 428/137 |
| 2008/0220373 A1* | 9/2008 | Choi ...................... H05K 3/102 430/311 |
| 2008/0258299 A1 | 10/2008 | Kang et al. |
| 2009/0002964 A1 | 1/2009 | Haba |
| 2009/0039507 A1 | 2/2009 | Funaki |
| 2009/0039528 A1 | 2/2009 | Haba et al. |
| 2009/0071707 A1 | 3/2009 | Endo et al. |
| 2009/0071837 A1* | 3/2009 | Fredenberg ......... B81C 99/0085 205/131 |
| 2009/0091024 A1 | 4/2009 | Zeng et al. |
| 2009/0115047 A1 | 5/2009 | Haba et al. |
| 2009/0121348 A1 | 5/2009 | Chang |
| 2009/0146303 A1 | 6/2009 | Kwon |
| 2009/0148594 A1 | 6/2009 | Moran et al. |
| 2009/0188706 A1 | 7/2009 | Endo |
| 2009/0243095 A1 | 10/2009 | Fujita et al. |
| 2009/0302466 A1 | 12/2009 | Shoji et al. |
| 2010/0044860 A1 | 2/2010 | Haba et al. |
| 2010/0102452 A1 | 4/2010 | Nakao |
| 2010/0301485 A1 | 12/2010 | Sekine et al. |
| 2011/0074027 A1 | 3/2011 | Kwon |
| 2012/0025365 A1* | 2/2012 | Haba .................... H01L 21/4853 257/692 |
| 2012/0217165 A1* | 8/2012 | Feng ...................... C25D 5/022 205/135 |
| 2012/0248618 A1* | 10/2012 | Akino ..................... H01L 24/05 257/773 |
| 2012/0273936 A1* | 11/2012 | Uang ................ H01L 23/49816 257/737 |
| 2013/0040451 A1* | 2/2013 | Dragoi ................. H01L 25/0657 438/597 |
| 2013/0099376 A1 | 4/2013 | Haba |
| 2013/0136917 A1* | 5/2013 | Dastoor ............... C09D 7/1266 428/323 |
| 2014/0001636 A1* | 1/2014 | Saito ....................... C25D 5/12 257/753 |
| 2015/0014399 A1* | 1/2015 | Ogashiwa ............... H01L 24/83 228/248.1 |
| 2015/0027755 A1* | 1/2015 | Tsujimoto ............. B82Y 30/00 174/253 |
| 2015/0357538 A1* | 12/2015 | Hsing Chen ............ H01L 33/60 257/98 |
| 2016/0168715 A1* | 6/2016 | Ma ...................... C23C 18/1607 174/268 |

FOREIGN PATENT DOCUMENTS

| | | |
|---|---|---|
| EP | 0615283 A1 | 9/1994 |
| EP | 1091406 A2 | 4/2001 |
| EP | 1255295 A1 | 11/2002 |
| EP | 1387402 A2 | 2/2004 |
| EP | 1471570 A1 | 10/2004 |
| EP | 1602749 | 12/2005 |
| JP | 54148484 | 11/1979 |
| JP | 62117346 A | 5/1987 |
| JP | 63153889 | 6/1988 |
| JP | 64086527 | 3/1989 |
| JP | H04151843 A | 5/1992 |
| JP | 06268015 A | 9/1994 |
| JP | 7211722 A | 8/1995 |
| JP | 08031835 | 2/1996 |
| JP | 10013003 | 1/1998 |
| JP | H10125734 A | 5/1998 |
| JP | 11087556 | 3/1999 |
| JP | 11097576 A | 4/1999 |
| JP | 11111886 | 4/1999 |
| JP | 2000100869 A | 4/2000 |
| JP | 2000277649 A | 10/2000 |
| JP | 2001118872 A | 4/2001 |

(56) References Cited

FOREIGN PATENT DOCUMENTS

| | | | |
|---|---|---|---|
| JP | 2001244365 A | 9/2001 |
| JP | 2002016096 A | 1/2002 |
| JP | 2002043506 A | 2/2002 |
| JP | 2002124548 A | 4/2002 |
| JP | 2002261204 A | 9/2002 |
| JP | 2002313993 A | 10/2002 |
| JP | 2002313996 A | 10/2002 |
| JP | 2002359471 A | 12/2002 |
| JP | 2003007768 A | 1/2003 |
| JP | 2003037135 A | 2/2003 |
| JP | 2003051665 A | 2/2003 |
| JP | 2003092472 A | 3/2003 |
| JP | 2003124250 A | 4/2003 |
| JP | 2004128230 A | 4/2004 |
| JP | 2004221450 A | 8/2004 |
| JP | 2004273957 A | 9/2004 |
| JP | 2004342802 A | 12/2004 |
| JP | 2004349390 A | 12/2004 |
| JP | 2005026645 A | 1/2005 |
| JP | 2005032964 A | 2/2005 |
| JP | 2005045191 A | 2/2005 |
| JP | 2005093512 A | 4/2005 |
| JP | 2005123547 A | 5/2005 |
| JP | 2005216696 A | 8/2005 |
| JP | 2005243761 A | 9/2005 |
| JP | 2005285986 A | 10/2005 |
| JP | 2006005322 A | 1/2006 |
| JP | 2007023338 A | 2/2007 |
| JP | 2007129207 A | 5/2007 |
| JP | 2007242900 A | 9/2007 |
| JP | 2007266555 A | 10/2007 |
| JP | 2009177118 A | 8/2009 |
| JP | 2010521587 A | 6/2010 |
| WO | 0141207 A1 | 6/2001 |
| WO | 2005122706 A2 | 12/2005 |
| WO | 2006004672 A1 | 1/2006 |
| WO | 2006057097 A1 | 6/2006 |
| WO | 2008000020 A1 | 1/2008 |
| WO | 2008076428 A1 | 6/2008 |
| WO | 2008112318 A2 | 9/2008 |
| WO | 2009/020572 A2 | 2/2009 |
| WO | 2009017758 A2 | 2/2009 |
| WO | 2009023283 A2 | 2/2009 |
| WO | 2009023284 A2 | 2/2009 |
| WO | 2009045371 A2 | 4/2009 |

OTHER PUBLICATIONS

Non-Final Office Action dated Dec. 21, 2011, filed in U.S. Appl. No. 12/462,208.
Amendment to Non-Final Office Action dated May 21, 2012, filed in U.S. Appl. No. 12/462,208.
Final Rejection dated Sep. 13, 2012, filed in U.S. Appl. No. 12/462,208.
Amendment Accompanying RCE dated Mar. 13, 2013, filed in U.S. Appl. No. 12/462,208.
Non-Final Office Action dated Apr. 8, 2013, filed in U.S. Appl. No. 12/462,208.
Amendment to Non-Final Office Action dated Aug. 8, 2013, filed in U.S. Appl. No. 12/462,208.
Final Rejection dated Nov. 22, 2013, filed in U.S. Appl. No. 12/462,208.
Non-Final Office Action dated Mar. 28, 2014, filed in U.S. Appl. No. 12/462,208.
Amendment Submitted with RCE dated Feb. 24, 2014, filed in U.S. Appl. No. 12/462,208.
U.S. Appl. No. 60/875,730, filed Dec. 19, 2006.
U.S. Appl. No. 60/964,916, filed Aug. 15, 2007.
U.S. Appl. No. 60/964,823, filed Aug. 15, 2007.
U.S. Appl. No. 60/963,209, filed Aug. 3, 2007.
U.S. Appl. No. 60/964,069, filed Aug. 9, 2007.
U.S. Appl. No. 60/962,200, filed Jul. 27, 2007.
U.S. Appl. No. 60/936,617, filed Jun. 20, 2007.
Amendment to Non-Final Office Action dated May 2, 2014, filed in U.S. Appl. No. 12/965,192.
Non-Final Office Action dated Mar. 21, 2014, filed in U.S. Appl. No. 12/965,192.
Taiwanese Office Action for Application No. 100145661 dated Sep. 25, 2014.
JP Office Action for Application No. JP2009-553652 dated Nov. 11, 2014.
Japanese Office Action for Application No. JP2013-543342 dated Sep. 18, 2015.
International Search Report and Written Opinion, PCT/US2009/004694, mailed Dec. 7, 2009.
Choubey A; Hao Yu; Osterman M; Pecht M; Fu Yun; Li Yonghong; Xu Ming: "Intermetallics Characterization of lead-free solder joints under isothermal aging" Journal of Electronic Materials, vol. 37, No. 8, May 28, 2008 (May 28, 2008), pp. 1130-1138, XP002555807.
Co-Pending U.S. Appl. No. 11/717,587, US Final Office Action dated Mar. 16, 2011.
Co-Pending U.S. Appl. No. 11/717,587, Amendment dated Sep. 16, 2011.
North Corporation, "Processed Intra-layer Interconnection Material for PWBs [Etched Copper Bump with Copper Foil]," NMBITM, Version 2001.6.
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
Co-Pending U.S. Appl. No. 11/166,982, Non-final Rejection dated Mar. 21, 2008.
Co-Pending U.S. Appl. No. 11/166,982, Amendment dated Jun. 23, 2008.
International Search Report, PCT/US2008/03473 dated Sep. 15, 2008.
Office Action from Japanese Application No. 2007-518347 dated Feb. 1, 2011.
Korean Office Action for Application No. 10-2011-7006476 dated May 30, 2012.
International Search Report, PCT/US2008/011271, dated Mar. 27, 2009.
U.S. Appl. No. 12/965,192, filed Dec. 10, 2010.
U.S. Appl. No. 12/965,172, filed Dec. 10, 2010.
Supplementary Partial European Search Report for Application No. EP 08835829 dated Feb. 21, 2012.
Extended European Search Report for Application No. EP 08835829.6 dated Feb. 28, 2012.
U.S. Appl. No. 60/508,970, filed Oct. 6, 2003.
U.S. Appl. No. 60/633,210, filed Dec. 30, 2003.
U.S. Appl. No. 60/533,393, filed Dec. 30, 2003.
Japanese Office Action for Application No. 2007-518347 dated Nov. 2, 2012.
Chinese Office Action for Application No. 200980141969.8 dated Jan. 28, 2013.
International Search Report and Written Opinion for Application No. PCT/US2011/043152, dated Dec. 9, 2011.
Office Action from Taiwan Application No. 100124338 dated Dec. 6, 2013.
Office Action for Chinese Application No. 200980141969.8 dated Dec. 18, 2013.
EP Report for Application No. 11740758.5 dated Nov. 27, 2013.
Chinese Office Action for Application No. 200880117714.3 dated Jul. 18, 2012.
European Office Action for Application No. 08835829.6 dated Oct. 19, 2012.
Printout from Merriam-Webster, Definition of Pad, printed on Feb. 25, 2013.
Japanese Office Action for Application No. 2007-332727 dated Oct. 30, 2012.
Japanese Office Action for Application No. 2010-526972 dated Jan. 25, 2013.
Chinese Office Action for Application No. 200880117714.3 dated Jan. 29, 2013.

(56) References Cited

OTHER PUBLICATIONS

International Search Report for Application No. PCT/US2011/063953 dated Mar. 29, 2012.
Yamada H et al., "A fine pitch and high aspect ratio bump array for flip-chip interconnection", Proceedings of the International Electronic Manufacturing Technology Symposium, Baltimore, USA, Sep. 28-30, 1992, New York, USA, IEEE, vol. SYMP. 13, Sep. 28, 1992 (Sep. 28, 1992), pp. 288-292, XP010259441.
Yamada H et al., "A fine pitch and high aspect ratio bump fabrication process for flip-chip interconnection", Proceedings of the Electronic Manufacturing Technology Symposium, Omiya, Japan, Dec. 4-6, 1995, New York, USA, IEEE, Dec. 4, 1995 (Dec. 4, 1995), pp. 121-124, XP010195564.
Partial European Search Report for Application No. EP13164353 dated Aug. 7, 2013.
Non-Final Office Action dated Feb. 29, 2012, filed in U.S. Appl. No. 12/965,172.
Amendment to Non-Final Office Action dated Jul. 30, 2012, filed in U.S. Appl. No. 12/965,172.
Final Office Action dated Aug. 27, 2012, filed in U.S. Appl. No. 12/965,172.
Amendment to Final Office Action dated Feb. 27, 2013, filed in U.S. Appl. No. 12/965,172.
Non-Final Office Action dated Jul. 10, 2013, filed in U.S. Appl. No. 12/965,172.
Extended European Search Report for Application No. 13164353.8 dated Feb. 7, 2014.
Chinese Office Action for Application No. 200880011888.1 dated Feb. 18, 2014.
Non-Final Office Action dated Dec. 16, 2011, filed in U.S. Appl. No. 12/317,707.
Amendment to Non-Final Office Action dated May 16, 2012, filed in U.S. Appl. No. 12/317,707.
Final Office Action dated Mar. 28, 2014 filed for U.S. Appl. No. 13/795,473.
Non Final Office Action dated Dec. 5, 2013 filed for U.S. Appl. No. 13/795,473.
Amendment to Non Final Office Action dated Mar. 4, 2014 filed for U.S. Appl. No. 13/795,473.
Japanese Office Action for Application No. 2010-526972 dated Apr. 8, 2014.
Amendment to Non-Final Office Action dated Dec. 10, 2013, filed in U.S. Appl. No. 12/965,172.
Supplemental Amendment dated Jan. 7, 2014, filed in U.S. Appl. No. 12/965,172.
International Search Report for Application No. PCT/US2016/041000 dated Oct. 18, 2016.

\* cited by examiner

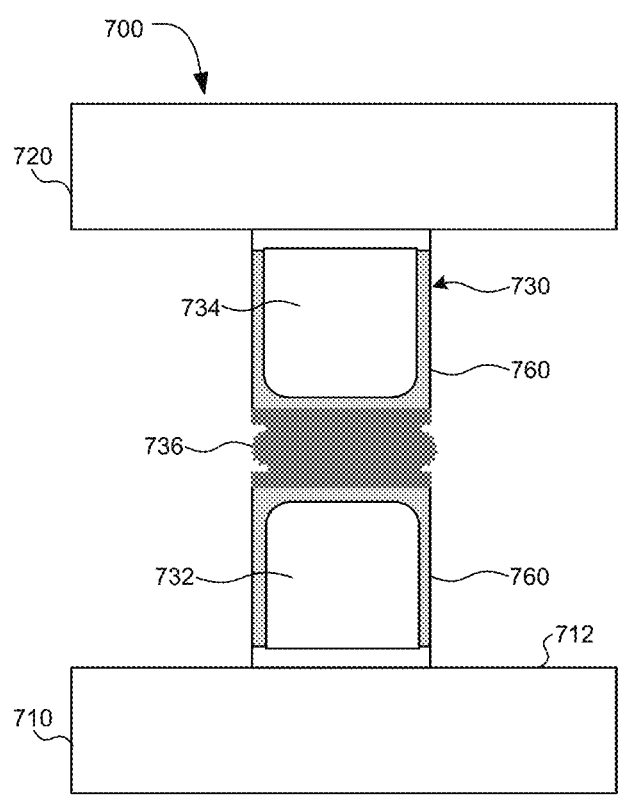
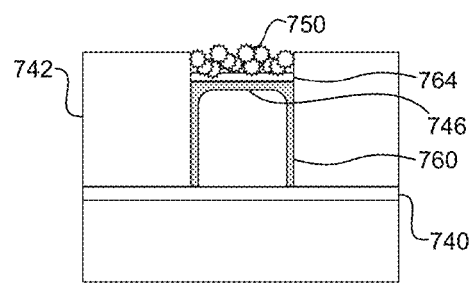
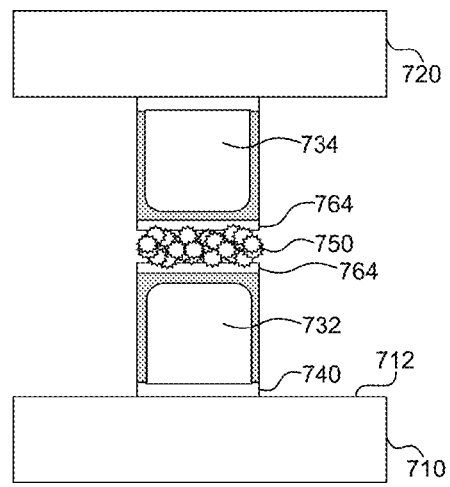
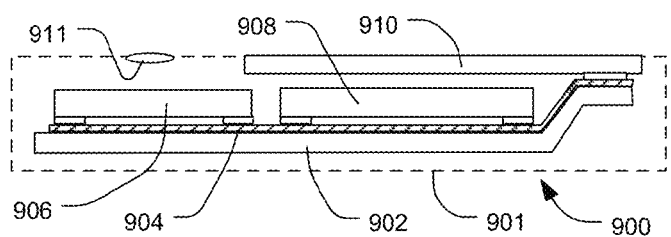

STRUCTURES AND METHODS FOR LOW TEMPERATURE BONDING USING NANOPARTICLES

BACKGROUND OF THE INVENTION

The present invention relates to microelectronic packages, to components for use in fabrication of microelectronic packages, and to methods of making the packages and components.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

In one face of the semiconductor chip is fabricated the active circuitry. To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, gold, or aluminum, around 0.5 µm thick. The size of the bond pads will vary with the device type but will typically measure tens to hundreds of microns on a side.

Flip-chip interconnection is a commonly used scheme for conductively connecting bond pads on the semiconductor chip to contact pads on a substrate, or to one or more other semiconductor chips. In flip-chip interconnection, lumps of metal are typically placed or formed on each bond pad. The die is then inverted so the metal lumps provide both the electrical pathway between the bond pads and the substrate as well as the mechanical attachment of the die to the substrate.

There are many variations of the flip-chip process, but one common configuration is to use solder for the lumps of metal and fusion of the solder as the method of fastening it to the bond pads and the substrate. When it melts, the solder flows to form truncated spheres.

It is becoming more difficult to package semiconductor chips in a flip-chip manner in which the contacts of the chip face toward corresponding contacts of a package substrate. Increased density of the chip contacts is causing the pitch between contacts to be reduced. Consequently, the volume of solder available for joining each chip contact to the corresponding package contact is reduced. An risk with the use of a relatively small volume of solder for contact joining is that the entire volume of solder may be converted into a brittle inter-metallic compound with the metal of the contacts, which may jeopardize the reliability of the solder joints.

Moreover, smaller solder joints cause the stand-off height between the contact-bearing chip surface and the adjacent face of the package substrate to be reduced. However, when the contact density is very high, the stand-off height may need to be greater than the height of a simple solder joint in order to form a proper underfill between the adjacent surfaces of the chip and package substrate. In addition, it may be necessary to require a minimum stand-off height in order to allow the contacts of the package substrate to move somewhat relative to the contacts of the chip in order to compensate for differential thermal expansion between the chip and the substrate.

One approach that has been proposed to address these concerns involves forming metal columns by electroplating a metal such as copper directly on the chip contacts, using a photoresist mask overlying the chip front surface to define the locations and height of the columns. The chip with the columns extending from the bond pads thereon can then be joined to corresponding contacts of the package substrate. Alternatively, a similar approach can be taken to form metal columns on exposed pads of the substrate. The substrate with the columns extending from the contacts thereon can then be joined to corresponding contacts of the chip.

However, the process of forming the columns by electroplating can be problematic when performed simultaneously over a large area, such as, for example, the entire area of a wafer (having a diameter from about 200 millimeters to about 300 millimeters) or over the entire area of a substrate panel (typically having dimensions of about 500 millimeters square). It is difficult to achieve metal columns with uniform height, size and shape across the substrate. All of these are very difficult to achieve when the size and height of the columns is very small, e.g., at column diameters of about 75 microns or less and column heights of about 50 microns or less. Variations in the thickness of the photoresist mask, uniformity of the pattern layout, local variation in pad density, local variation in mass transport of the electrolyte, local variations in the plating current distribution, or variations in the size of shape of patterns over a large area such as a wafer or substrate panel can interfere with obtaining columns of uniform height, size and shape.

In another method, bumps of solder paste or other metal-filled paste can be stenciled onto conductive pads on an exposed surface of a substrate panel. The bumps can then be flattened by subsequent coining to improve planarity. However, tight process control can be required to form bumps having uniform solder volume, especially when the pitch is very small, e.g., about 50 microns or less. It can also be very difficult to eliminate the possibility of solder-bridging between bumps when the pitch is very small, e.g., about 50 microns or less.

Despite the advances that have been made in flip chip interconnections, there is still a need for further improvements.

BRIEF SUMMARY OF THE INVENTION

A method of making an assembly can include forming a first conductive element at a first surface of a substrate of a first component, the first conductive element extending in a direction away from the first surface, and forming conductive nanoparticles at a surface of the conductive element by exposure to an electroless plating bath, the conductive nanoparticles having long dimensions smaller than 100 nanometers. The method can also include juxtaposing the surface of the first conductive element with a corresponding surface of a second conductive element at a major surface of a substrate of a second component, with the conductive nanoparticles disposed between the surfaces of the first and second conductive elements. The method can further include elevating a temperature at least at interfaces of the juxtaposed first and second conductive elements to a joining temperature at which the conductive nanoparticles cause metallurgical joints to form between the juxtaposed first and second conductive elements.

In one example, the first conductive element can be one of a plurality of first conductive elements at the first surface, and the second conductive element can be one of a plurality of second conductive elements at the major surface, corresponding surfaces of the first and second conductive elements being juxtaposed with one another. The method can also include, during the juxtaposing step, compressing the thickness of the bond region by different distances among different ones of the juxtaposed first and second conductive elements, the thickness of the bond region varying among the different ones of the juxtaposed first and second conductive elements by up to 3 microns so as to accommodate non-coplanarity of the top surfaces of the at least some of the first conductive elements.

In a particular embodiment, the first conductive element can be a substantially rigid post, and the surface of the first conductive element can be a top surface that projects a height above the first surface of the first component such that the top surface is remote from the first surface, the post having edge surfaces extending at substantial angles away from the top surface. The forming of the conductive nanoparticles can deposit the conductive nanoparticles onto the edge surfaces of the post, the nanoparticles substantially completely covering the top surface and the edge surfaces of the post.

In one embodiment, after the elevating temperature step, the interface of the juxtaposed first and second conductive elements can contain microvoids, each microvoid having a maximum width below 0.5 microns. In a particular example, at least one of the first or second components can be a microelectronic element including active semiconductor devices, and the joining temperature can be not more than 150° C. In an exemplary embodiment, at least one of the first and second conductive elements can comprise an electrically conductive pad or an electrically conductive trace.

Another method of making an assembly can include forming conductive nanoparticles at a surface of a first conductive element at a first surface of a substrate of a first component by exposing the first conductive element to an electrolytic bath at a current density greater than the mass transport limiting current density of the plating bath, the conductive nanoparticles having long dimensions smaller than 100 nanometers. The method can also include juxtaposing the surface of the first conductive element with a corresponding surface of a second conductive element at a major surface of a substrate of a second component, with the conductive nanoparticles disposed between the surfaces of the first and second conductive elements. The method can further include elevating a temperature at least at interfaces of the juxtaposed first and second conductive elements to a joining temperature at which the conductive nanoparticles cause metallurgical joints to form between the juxtaposed first and second conductive elements.

In one example, the method can also include, before forming the conductive nanoparticles, forming the plurality of first conductive elements by depositing a seed layer onto the first surface of the substrate of the first component and forming the first conductive elements extending from the seed layer. In a particular embodiment, the method can also include, after forming the conductive nanoparticles, forming a dielectric mask covering the conductive nanoparticles and removing a portion of the seed layer from the first surface adjacent the first conductive element. In one embodiment, the method can also include, before forming the conductive nanoparticles, forming the first conductive element on the first surface of a substrate of the first component, the first conductive element extending in a direction away from the first surface.

In a particular example, the first conductive element can be a substantially rigid post, and the surface of the first conductive element can be a top surface that projects a height above the first surface of the first component such that the top surface is remote from the first surface, the post having edge surfaces extending at substantial angles away from the top surface thereof. In an exemplary embodiment, the second conductive element can be a substantially rigid post, and the surface of the second conductive element can be a top surface that projects a height above the major surface of the second component such that the top surface is remote from the major surface, the post of the second component having edge surfaces extending at substantial angles away from the top surface thereof. In one example, at least one of the first and second conductive elements can comprise an electrically conductive pad or an electrically conductive trace.

An assembly can include a first component including a substrate having a first surface and a plurality of substantially rigid first posts at the first surface, the first posts extending away from the first surface in a first direction, each first post having a top surface generally facing in the first direction, the top surface of each of the first posts projecting a height above the first surface such that the top surface is remote from the first surface, each first post having edge surfaces extending at substantial angles away from the top surface thereof. The assembly can also include a second component including a substrate having a major surface and a plurality of second conductive elements at the major surface, each second conductive element having a top surface generally facing in a second direction.

The first posts can be joined with the second conductive elements, such that the top surfaces of the first posts at least partially confront the top surfaces of the second conductive elements. The top surfaces of at least some of the first posts can be non-coplanar with respect to one another. Each first post can be electrically interconnected to a corresponding one of the second conductive elements by a bond region including impurities that show structural evidence of the use of metal nanoparticles having long dimensions smaller than 100 nanometers in the joining process. Each bond region can penetrate at least partially into the first post and the second conductive element. Each bond region can contain a plurality of microvoids. Each microvoid can have a maximum width below 0.5 microns. The thickness of different ones of the bond regions can vary by up to 3 microns so as to accommodate the non-coplanarity of the top surfaces of the at least some of the first posts.

In one example, the assembly can also include a barrier layer substantially completely covering the top surface and the edge surfaces of each first post, each bond region being located between the barrier layer of a respective one of the first posts and the top surface of a corresponding one of the second conductive elements. In a particular embodiment, the plurality of second conductive elements can be substantially rigid second posts extending away from the major surface in the second direction, and the top surface of each of the second posts can project a height above the major surface of the second component such that the top surface is remote from the major surface, each second post having edge surfaces extending at substantial angles away from the top surface thereof. In one embodiment, the edge surfaces of each of the first posts and second posts can have a surface roughness of at least 3.0 nanometers. In a particular example, at least one of the first or second components can be a microelectronic element including active semiconductor devices.

In an exemplary embodiment, the first posts and the second conductive elements can each consist essentially of the same material, and the bond region can include at least one metal selected from a group consisting of copper, gold, silver, nickel, tin, aluminum, an alloy including silver, an alloy including indium, and an alloy including tin. In one example, at least one of the first posts and second conductive elements can comprise an electrically conductive pad or an electrically conductive trace. In a particular embodiment, the first component can be a microelectronic element wafer including a plurality of microelectronic element portions, each microelectronic element portion including a respective subset of the first posts at the first surface, and the second component can be at least a portion of a substrate panel including a plurality of substrate portions, each substrate portion including a respective subset of the second conductive elements at the major surface.

In one embodiment, a system can include an assembly as described above and one or more other electronic components electrically connected to the assembly. In a particular example, the system can also include a housing, the assembly and the other electronic components being mounted to the housing. Further aspects of the invention can provide systems that incorporate assemblies according to the foregoing aspects of the invention, composite chips according to the foregoing aspects of the invention, or both in conjunction with other electronic components electrically connected thereto. For example, the system can be disposed in and/or mounted to a single housing, which can be a portable housing. Systems according to preferred embodiments in this aspect of the invention can be more compact than comparable conventional systems.

BRIEF DESCRIPTION OF THE DRAWINGS

FIG. 7 is a diagrammatic side sectional view of an assembly according to an alternative embodiment of the assembly shown in FIG. 5.

FIGS. 8A and 8B are side sectional views illustrating stages of fabrication in accordance with the embodiment depicted in FIG. 7.

FIG. 9 is a schematic depiction of a system according to one embodiment of the invention.

DETAILED DESCRIPTION

As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. In some embodiments, the conductive element may be attached to the surface or may be disposed in one or more layers of dielectric coating on the said surface.

Figure 1:
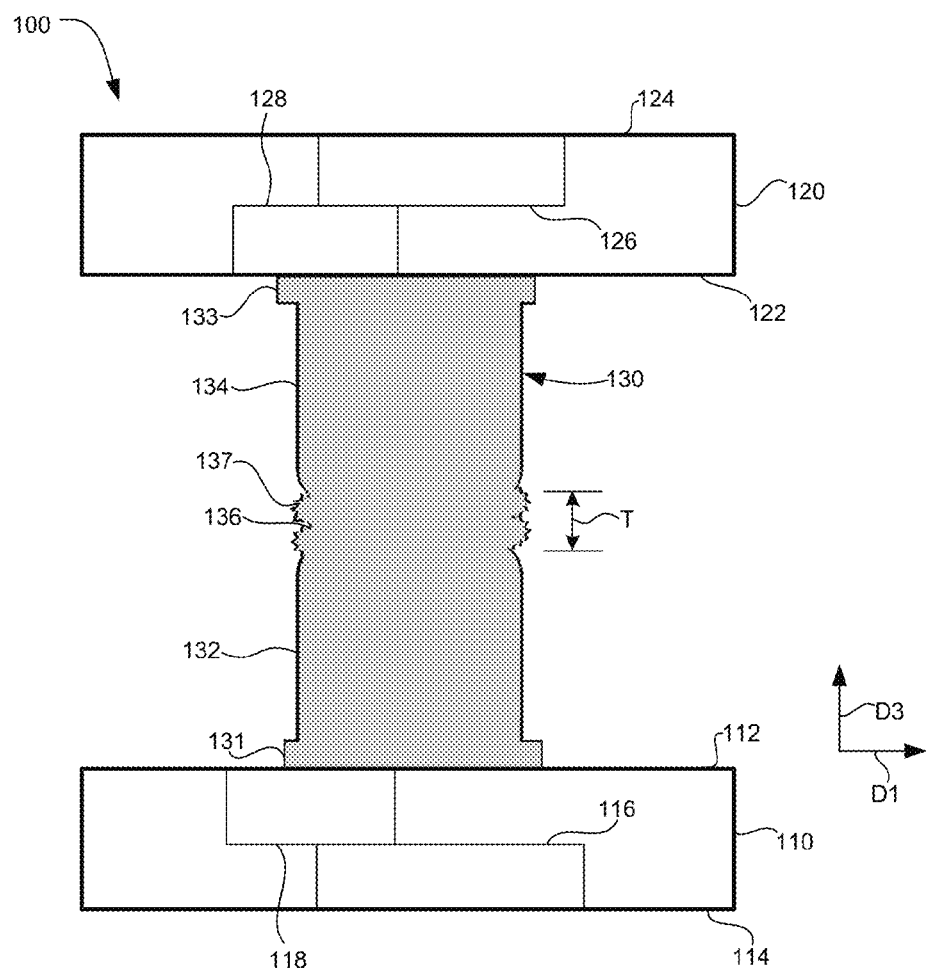
FIG. 1 is a diagrammatic side sectional view of an assembly according to an embodiment of the present invention.

As illustrated in FIG. 1, an assembly 100 can include a first substrate 110 having a major surface 112 extending in a first direction D1 and in a second direction transverse to the first direction, a second substrate 120 having a major surface 122 extending in the first and second directions, and a conductive column 130 extending in a third direction D3 transverse to the first and second directions, the column providing an electrical connection between conductive elements 131 and 133 at the major surface 112 and the major surface 122, respectively. Although only a single column 130 is shown and described with reference to FIG. 1, it is to be understood that the first and second substrates 110, 120 may be joined by an m×n array of conductive columns, one or both of m and n being greater than one. The column 130 (and the other conductive columns described herein) may be used, for example, to carry signals or information, power, heat, or a reference potential, between the first substrate 110 and the second substrate 120.

In FIG. 1, the first and second directions parallel to the major surface 112 and the major surface 122 are referred to herein as "horizontal" or "lateral" directions, whereas the directions perpendicular to the major surfaces, such as the third direction D3, are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

In some embodiments, one or both of the substrates 110 and 120 can be a semiconductor chip, a wafer, glass, ceramic, glass-ceramic, a polymer, composite material, a flat panel, or the like. One or both of the substrates 110 and 120 may consist essentially of an inorganic material such as silicon. The thickness of one or both of the substrates 110 and 120 between its major surface and a respective second surface 114 or 124 opposite to the major surface can be less than 500 μm, and can be significantly smaller, for example, 130 μm, 70 μm or even smaller.

One or both of the substrates 110 and 120 can have a coefficient of thermal expansion ("CTE") less than 10 parts per million per degree Centigrade in a plane of the substrate ("ppm/° C."). In a particular embodiment, one or both of the substrates 110 and 120 can have a CTE less than 7 ppm/° C. In other embodiments, the CTE of one or both of the substrates 110 and 120 can be less than 20 ppm/° C. In one example, the CTE of one or both of the substrates 110 and 120 can be greater than 22 ppm/° C.

In some embodiments, one or both of the substrates 110 and 120 can be made from a material such as semiconductor material, ceramic, glass, liquid crystal material, a composite material such as glass-epoxy or a fiber-reinforced composite, a laminate structure, or a combination thereof. In some embodiments, one or both of the substrates 110 and 120 can be a supporting dielectric element, e.g., a tape used in tape automated bonding ("TAB"). In one example, one or both of the substrates 110 and 120 can consist essentially of a dielectric element having a coefficient of thermal expansion in a plane of the substrate of less than 10 ppm/° C. In a particular embodiment, the substrate 102 can consist essentially of a dielectric element having a coefficient of thermal expansion in a plane of the substrate of between about 10 and about 20 ppm/° C. In one particular embodiment, one or both of the substrates 110 and 120 can consist essentially of a dielectric element having a coefficient of thermal expansion in a plane of the substrate of between about 10 and about 20 ppm/° C. and an out-of-plane coefficient of thermal expansion between about 15 and about 60 ppm/° C. In one example, one or both of the substrates 110 and 120 can have a Young's modulus of less than 4 GPa.

One or both of the substrates 110 and 120 can further include an insulating dielectric layer (not shown) overlying the respective major surface 112 or 122 and/or the respective second surface 114 or 124. Such dielectric layers can electrically insulate conductive elements such as the column 130 from the substrate, when the substrate comprises an electrically conductive material or a semiconductor material. These dielectric layers can be referred to as "passivation layers" of the substrate. Such dielectric layers can include an inorganic or organic dielectric material or both. Such dielectric layers can include an electrodeposited conformal coating or other dielectric material, for example, a photoimageable polymeric material, for example, a solder mask material.

One or both of the substrates 110 and 120 can further include conductive structure 116 or 126 therein. Such conductive structure can include traces extending along one or both of the major and second surfaces, conductive interconnects or conductive vias extending between or in a direction between the respective major surface 112 or 122 and/or the respective second surface 114 or 124, and terminals 118 or 128 at the respective second surface for electrical connection with a component external to the assembly 100.

In embodiments where one or both of the substrates 110 and 120 include a semiconductor substrate, made for example from silicon, one or a plurality of semiconductor devices (e.g., transistors, diodes, etc.) can be disposed in an active device region thereof located at and/or below the respective major surface 112 or 122.

The conductive column 130 can include a first electrically conductive element or portion 132 and a second electrically conductive element or portion 134. The first portion 132 can be electrically connected to and joined with one or more conductive elements 131 at the major surface 112 of the first substrate 110, and the second portion 134 can be electrically connected to and joined with one or more conductive elements 133 at the major surface 122 of the second substrate 120. Each of the first and second portions 132, 134 can be a metal post extending from the respective major surface 112, 122 in the third direction D3 or in a direction opposite the third direction, such metal posts including substantially rigid elements such as vertically-extending portions of metal.

The first and second portions 132, 134 can each include a conductive material such as copper, aluminum, tungsten, solder, gold, nickel, indium, silver, an alloy including copper, an alloy including nickel, an alloy including tungsten, or a combination of one or more of the aforementioned materials, among others. In one example, each of the first and second portions 132, 134 can consist essentially of copper. The first and second portions 132, 134 can each comprise the same metal, or the first portion may comprise a different metal than the second portion.

The conductive column 130 can also include a first conductive element 131 at the major surface 112 of the first substrate 110 and/or a second conductive element 133 at the major surface 122 of the second substrate 112. Such a conductive element 131 or 133 can be a thin, flat pad of metal, such as copper, aluminum, nickel, or another suitable material. Such a conductive element 131 or 133 can comprise the same metal as one or both of the first and second portions 132, 134, or it may comprise a metal that is different from that of one or both of the first and second portions. In some embodiments, one or both of the first and second conductive elements 131, 133 can comprise a barrier layer or barrier material. In one example, one or both of the first and second conductive elements 131, 133 can be integrally formed with one or both of the first and second portions 132, 134.

The conductive column 130 can include a bond region 136 that can include structural evidence of nanoparticles having been joined together in a prior bonding operation. As used herein, the term "nanoparticles" includes nanomaterials in any form, including, for example, clusters of nanoparticles having long dimensions typically smaller than about 100 nanometers, nanoparticles suspended in a liquid, or nanoparticles suspended in a paste containing a surfactant. The bonding region may or may not comprise any remaining liquid, e.g., surfactant or solvent. The actual dimensions of the nanoparticles can be significantly smaller, e.g., having dimensions from about one nanometer and larger. In one example, the bond region 136 can penetrate at least partially into each of the first and second portions 132, 134. Such nanoparticles can also be arranged as dendritic deposits at one or more surfaces of metal posts that can comprise the first and second portions 132, 134 of the conductive column 130.

In one example, the bond region 136 can include a layer of nanoparticles consisting essentially of at least one of copper, gold, nickel, silver, alloys including silver, gallium, indium, alloys of gallium or indium, tin, bismuth, eutectic metal alloys, another metal, or a combination of metals. The nanoparticles can be coated with a very thin protective or non-protective layer of material (e.g., gallium, indium, tin, nickel), and the protective layer can be continuous or discontinuous. Such a protective or non-protective layer of material can lower the melting point of the nanoparticles. In one example, nanoparticles deposited onto the first portion 132 can be coated with gallium, and nanoparticles deposited onto the second portion 134 can be coated with indium, which can lower the melting point of the nanoparticles. Such a protective or non-protective layer of material can have a thickness of 5-10 nanometers, for example. Further details about such a protective or non-protective layer of material on nanoparticles can be found in U.S. Pat. No. 9,024,205, which is hereby incorporated herein by reference.

Nanoparticles can experience melting point depression, in which nanoscale materials can melt at temperatures substantially lower than bulk materials. In one example, the melting point of nanoparticles can be hundreds of degrees ° C. lower than that of a bulk region of the same material of which the nanoparticles consist. The melting point depression of metal nanoparticles is most pronounced when the metal has a particle diameter below about 50 nm. Having a bond region 136 that consists essentially of nanoparticles can allow the bond region to have a melting point at room temperature or within a few hundred ° C. above room temperature.

Joining the first and second substrates 110, 120 (and the other first and second substrates 310/510/710 and 320/520/720 described herein) together at a lower temperature (e.g., less than 200° C.) compared to that of conventional joining techniques can improve the structure of the final assembly 100, and can also benefit the process of making the assembly, which can improve yield and efficiency, thereby reducing fabrication cost. Typically, first and second portions 132, 134 (e.g., in the form of electrically conductive posts) of each substrate 110, 120 are juxtaposed in alignment with one another at a temperature just below the joining temperature. Then, the aligned posts are moved into contact with one another, and the assembly is heated to the joining temperature, at which time the nanoparticles on the respective first and second portions 132, 134 bond, such that the columns 130 form. In some embodiments, the nanoparticle regions between the substrates can fuse at room temperature when the mating regions touch. Subsequent higher-temperature processing can serve to improve both the mechanical and electrical integrity of the room-temperature joint. The substrate joining ambient environment can be inert, reducing, or a vacuum. In some applications, metallic oxide reducing fluids can be flowed around the substrates during the joining operation. In one embodiment, the fluid in the joining chamber can comprise a compound that enhances grain growth or grain growth rate in metals, for example, alcohol dispersed in an inert gas such as nitrogen.

In contrast to conventional solder joining processes at temperatures of approximately 250° C., reduced-temperature nanoparticle joining of substrates 110 and 120, which can have substantially different coefficients of thermal expansion, can result in significantly less strain and warpage in the final assembled product (e.g., the assembly 100). The reduced substrate warpage can be beneficial in subsequent assembly processes. This is because the difference between the temperature at which the structure is joined and the temperature at which the assembly is stored or operated is much smaller than with conventional processes. In such way, the assembled structure (e.g., the assembly 100) has less of a tendency to become warped as a result of the assembly process.

Moreover, the connections between individual portions 132, 134 of each column 130 formed at a lower joining temperature need not be quite as strong as in conventional structures, because conducting the assembly process at lower temperatures can apply less stress to each connection due to the smaller temperature differential between the joining temperature and temperatures at which the product is used or stored. The assembled package using the lower thermal budget processes for assembly can stiffen the package at lower temperatures. The stiffer package can have reduced warpage. Moreover, reducing the joining temperature can make it easier to align and join larger substrates together, thereby improving efficiency. These benefits described above can apply to all of the embodiments of the assemblies 100/300/500/700 described herein.

After the first and second portions 132, 134 are joined together by nanoparticles or nanomaterials in any form, the bond region 136 that joins the first and second portions together can show structural evidence that nanoparticles were used to join the first and second portions. For example, during joining of the first and second portions 132, 134, nanoparticles can diffuse into the first and second portions. After joining, the metal formerly comprising the nanoparticles are no longer in the form of clusters of nanoparticles having long dimensions typically smaller than about 100 nanometers.

The bond region 136 that joins the first and second portions 132, 134 together can show other structural evidence that nanoparticles were used to join the first and second portions, including the contour of the surface of the bond region. As shown in FIG. 1, the bond region 136 may have a scalloped or jagged surface 137 that generally extends in a circumferential direction about the column 130. The surface 137 of the bond region 136 may have a higher degree of surface roughness than the surface roughness of the first and second portions 132, 134. For example, the surface 137 may have a surface roughness that is greater than 30 nanometers. In one example, the surface 137 may have a surface roughness that is greater than 3.0 nanometers.

Another example of structural evidence that nanoparticles were used to join the first and second portions 132, 134 can be the presence of microvoids within the bond region 136. For example, the bond region 136 may include a plurality of microvoids that are each smaller than 0.5 microns, or the bond region may include microvoids that are each smaller than 0.2 microns. Such microvoids may be filled with air or dielectric material, for example. In one embodiment, the cross section of each void within the bond region can be less than 10% of the cross section of the bonded region. In particular examples, the cross section of each void within the bond region can be less than 5%, or less than 1% of the cross section of the bonded region. In one embodiment, the total area of the cross sections of the voids within a given cross section of the bond region can be less than 10% of the cross section of the bonded region. In particular examples, the total area of the cross sections of the voids within a given cross section of the bond region can be less than 5%, or less than 1% of the cross section of the bonded region.

In embodiments in which the first and second substrates 110, 120 are joined by an array of conductive columns 130, the thickness T of the bond region 136 in the third direction D3 may vary among the array of conductive columns by up to 3 microns, or between 0.5 microns and 3 microns, for example. The variation in the thickness of the bond regions 136 among the conductive columns 130 may be due to non-planarity among the top surfaces of an array of first portions 132 and/or non-planarity among the top surfaces of a corresponding array of second portions 134 before the corresponding first and second portions are joined to one another, as will be described below. In one embodiment, one of the first and second portions 132, 134 can be an electrically conductive trace or an electrically conductive pad (e.g., a flat piece of metal in the shape of a circle, oval, square, or rectangle). Thus, nanomaterials can be used to attach a conductive post to a conductive trace or a conductive pad at the major surface 112 or 122.

Figure 2A:
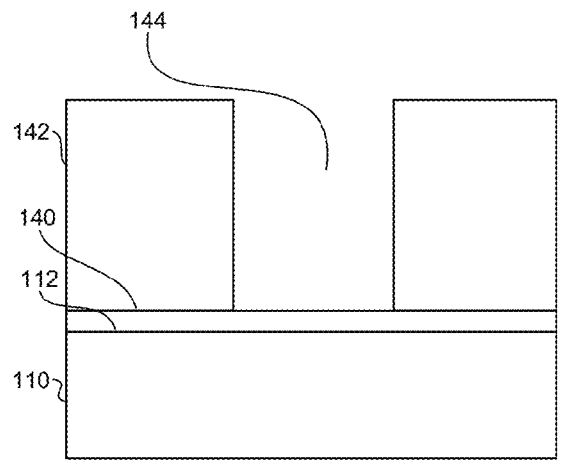
FIGS. 2A-2F are side sectional views illustrating stages of fabrication in accordance with the embodiment depicted in FIG. 1.

A method of fabricating the assembly 100 (FIG. 1) will now be described, with reference to FIGS. 2A-2F. Referring to FIG. 2A, a continuous metal seed layer 140 (e.g., copper) may be deposited onto the major surface 112 of the first substrate 110, or onto a dielectric layer overlying the major surface if the substrate comprises an electrically conductive material or a semiconductor material. The seed layer 140 can be deposited by various methods, including atomic layer deposition (ALD), physical vapor deposition (PVD), or electroless or electrolytic deposition methods. The seed layer can comprise copper, for example. The seed layer can also include an adhesion layer, a barrier layer, or both.

After the seed layer 140 is deposited onto the major surface 112, photoimageable layer such as a photoresist layer 142, can be deposited and patterned to cover only portions of the major surface 112. The photoresist layer 142 may have openings 144 at locations along the major surface 112 where it is desired to form columns 130.

Figure 2B:
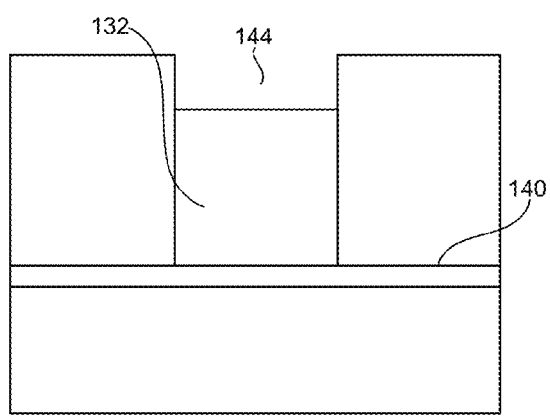

Then, as shown in FIG. 2B, the first portion 132 of the column 130 can be formed by depositing one or more conductive materials (e.g., copper) into the openings 144 in contact with the seed layer 140. In this example, the first portion 132 is deposited by electrolytic deposition. The first portion 132 can extend from the seed layer 140 in the third direction D3.

Figure 2C:
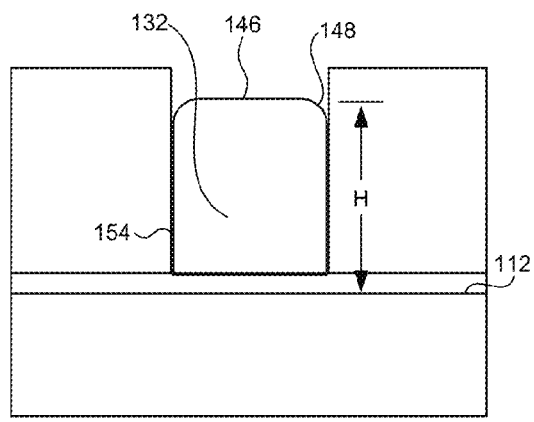

Next, as shown in FIG. 2C, the first portion 132 can be partially etched, defining a top surface 146 of the first portion generally facing in the third direction D3 that may have a rounded peripheral edge 148. This partial or mild etching step can expose high-index metal planes to permit the nanoparticles to nucleate. The first portion 132 can be a unitary substantially rigid metal post, and the top surface 146 can project a height H above the major surface 112 such that the top surface is remote from the major surface. The first portion 132 can define edge surfaces or sidewalls 154 extending at substantial angles away from the top surface 146.

Figure 2D:
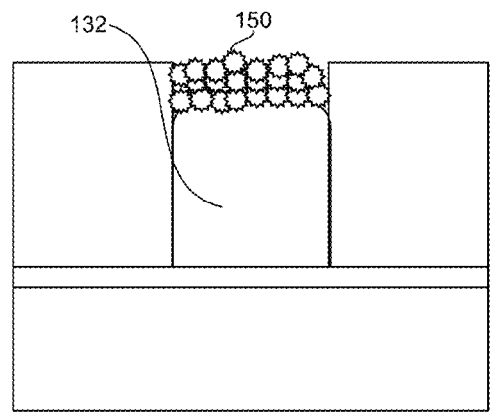

Then, as shown in FIG. 2D, nanoparticles 150 are deposited onto the top surface 146 of the first portion 132. In this example, the nanoparticles 150 are deposited by electrolytic deposition, in which the first portion 132 is exposed to an electrolytic bath at a current density greater than 50 mA/cm$^2$, so as to cause local depletion of metal ions at the top surface 146 during the plating step.

In one embodiment, after plating the first portion 132 onto the seed layer 140, the plating current density or voltage can be increased momentarily beyond the mass transport limit of the plating bath formulation. High current pulse plating can be employed to form the nanoparticles 150. The plating condition can be chosen to generate a layer or region of nanoparticles 150 without incorporating undesirable impurities within the layer or region.

For example, to plate the first portion 132 onto the seed layer 140, a copper plating bath containing organic additives, suppressors, brighteners, levelers, or various combinations thereof, can be used, with current densities between 10 and 40 mA/cm$^2$. Preferably, plating can be performed at current densities below the mass transport limit of the bath formulation, for a sufficient time to permit the first portion to be plated up to the height H shown in FIG. 2C.

To initiate depositing of the nanoparticles 150 onto the top surface 146, the plating current density can then be momentarily increased beyond the mass transport limit of the bath. The nanoparticles 150 can be deposited onto the top surface 146 by cycling the plating current density above and below the mass transport limit of the plating bath chemistry. In one example, the process of depositing the nanoparticles 150 onto the top surface 146 can comprise plating for 3 to 15 milliseconds above the mass transport limit and plating for 20 to 50 milliseconds below the mass transport limit of the plating bath.

The electrolytic deposition bath used to deposit the nanoparticles 150 onto the top surface 146 of the first portion 132 may be the same bath or a different bath than the one that is used to deposit the metal of the first portion 132 onto the seed layer 140.

In another embodiment, the first portion 132 can be plated onto the seed layer 140 using an additive metal plating bath, while the nanoparticles 150 can be deposited onto the top surface 146 of the first portion with a metal plating bath containing no organic additives. In some examples, metal grain refiners can be included in the plating bath, provided that the grain refiners do not introduce a large amount of undesirable impurities in the plated layer or region of nanoparticles 150.

In some embodiments, the metal comprising the first portion 132 can be different from metal comprising the nanoparticles 150. For example, the first portion 132 can comprise a metal or alloy deposited using a copper, gold, or nickel plating bath, and the nanoparticles 150 can comprise a lower-melting-point material, for example, gallium, indium, tin, and/or their respective alloys.

In another embodiment, the nanoparticles 150 deposited on the opposing top surfaces 146 and 146' of the first and second portions 132, 134 can comprise the same metal or different metals. For example, nanoparticles 150 comprising tin or tin alloys can be deposited or coated onto the top surface 146 of the first portion 132, while nanoparticles 150 comprising indium, gallium, or their respective alloys can be deposited or coated onto the top surface 146' of the second portion 134.

In a particular embodiment, after depositing of the first portion 132 onto the seed layer 140 using an electrolytic process, for example, the first substrate 110 can be cleaned and transferred into an electroless plating bath to deposit the nanoparticles 150 onto the top surface 146 of the first portion. For example, during electroless plating of the nanoparticles 150, an initially-deposited layer or region of the nanoparticles can be smooth and non-particulate, but the metal reduction stage of the electroless plating may be catalytically enhanced to initiate the depositing of a non-planar layer or region of nanoparticles onto the initially-deposited layer or region. The non-planar deposition of the nanoparticles 150 can be continued for a sufficient time to deposit the desired total thickness of the nanoparticles.

In some applications, the electroless bath can be partially decomposed to generate nanoparticles 150 of a metal of interest. The generated nanoparticles 150 can selectively coat and adhere to the top surface 146 of the first portion 132. The unwanted particulate can be catalytically or oxidatively dissolved in another overflow in-process chamber, and the bath can be recycled to deposit more nanoparticles.

Figure 2E:
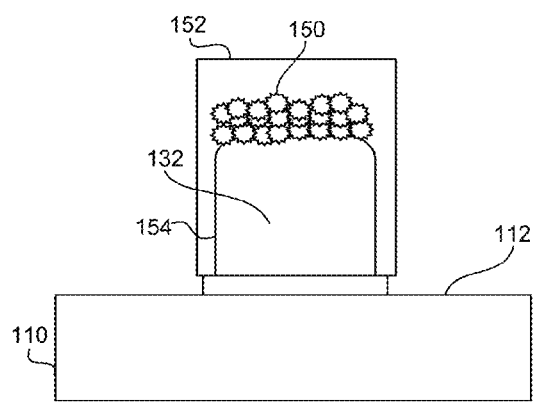

Next, as shown in FIG. 2E, the photoresist layer 142 may be removed, and then a dielectric protective mask 152 (e.g., a photoresist layer) may then be selectively deposited over the nanoparticles 150 and at least a portion of the sidewalls 154 of the first portion 132, to protect the nanoparticles and the first portions during removal of portions of the seed layer 140. The protective mask 152 may also extend over portions of the seed layer 140 where it is desired to have conductive traces extending along the major surface of the first substrate 110.

Then, the seed layer 140 may be removed at locations along the major surface 112 of the first substrate 110 where it is not desired to have conductive material (e.g., between adjacent ones of the first portions 132). After the excess portions of the seed layer 140 are removed, the protective mask 152 may be removed. The portions of the seed layer 140 that are not removed may form part of the conductive column 130 that extends between the major surfaces 112 and 122.

Figure 2F:
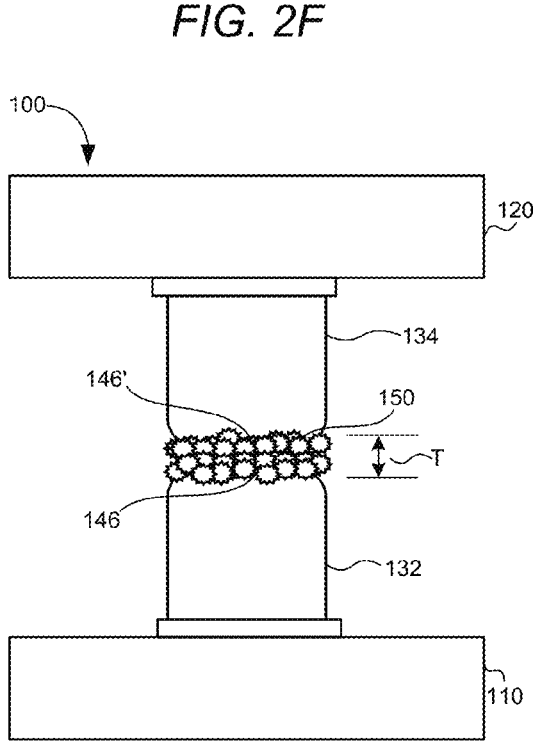

Then, as shown in FIG. 2F, the first portion 132 extending from the major surface 112 of the first substrate 110 may be joined with the second portion 134 extending from the major surface 122 of the second substrate 120. The second portion 134 may be formed using the same method steps shown and described with reference to FIGS. 2A-2E including application of the nanoparticles 150 thereon, or alternatively, the nanoparticles may be applied only to one of the first and second portions 132, 134 and not to the other portion.

To join the first portion 132 and the second portion 134 with one another, at least interfaces of the juxtaposed first and second portions of the assembly 100 may be heated to a temperature that is close to the joining or sintering temperature. Then, the first portion 132 and the second portion 134 are juxtaposed with one another, and the first and second portions can be aligned with one another in the first and second lateral directions.

Next, the first portion 132 and the second portion 134 can be brought into contact with one another, such that the nanoparticles 150 that were applied to one or both of the surfaces 146, 146' of the respective first and second portions can then join together to form a layer having a thickness T in the third direction D3 by up to 3 microns, or between 0.02 microns and 3 microns, or between 0.05 microns and 3 microns, for example. Therefore, the nanoparticles 350 can compensate for gaps or non-planarity between confronting corresponding surfaces 146, 146' of the respective first and second portions 132, 134. In one example, the surfaces 146 of the first portions 132 can at least partially confront the surfaces 146' of the second portion 134, the surfaces of at least some of the first portions being non-coplanar with respect to one another, and/or the surfaces of at least some of the second portions being non-coplanar with respect to one another.

Such gaps between the confronting corresponding top surfaces 146, 146' can be due to non-planarity among the top surfaces of a plurality or array of first portions 132 and/or non-planarity among the top surfaces of a corresponding plurality or array of second portions 134. In one example, during this juxtaposing step, the layer of nanoparticles 150 can be compressed by different distances among different ones of the juxtaposed first and second portions 132, 134, due to the non-planarity among the top surfaces of the first and second portions. In such an example, the thickness of the resulting bond region 136 can vary by up to 3 microns so as to accommodate the non-coplanarity of the top surfaces 146, 146' of at least some of the first and second portions 132, 134.

Then, at least interfaces of the juxtaposed first and second portions 132, 134 can be heated to a joining or sintering temperature, which preferably is below 200° C., more preferably below 180° C., or still more preferably below 150° C., at a relatively low pressure. During joining of the juxtaposed first and second portions 132, 134, an initial joining temperature can be below 100° C. before further heat processing at higher temperatures. At the joining temperature and sufficient pressure, the nanoparticles 150 may diffuse into both the first portion 132 and the second portion 134, thereby forming a metallurgical joint and joining the first and second portions together into a conductive column 130, as can be seen in FIG. 1.

Although the joining methods herein are described such that the top surfaces 146, 146' of the first and second portions 132, 134 are joined with one another, that need not be the case. In some examples, the edge surfaces or sidewalls 154 of the first and second portions 132, 134 may be joined to one another, or an edge surface of one of the first and second portions can be joined with a top surface of another one of the first and second portions. Also, although the joining top surfaces 146, 146' or edge surfaces 154 are shown as being planar, that need not be the case. Any or all of such top surfaces 146, 146' or edge surfaces 154 of one or both of the first and second portions 132, 134 to be joined can be planar or non-planar (e.g., convex, concave, non-linear, angled, multi-faceted, etc.).

In one example, one or both of the first and second portions 132, 134 can be formed on an electrically conductive trace or an electrically conductive pad at the major surface 112 and/or 122. In a particular embodiment, one or both of the first and second substrates 110, 120 can contain active and/or passive devices (e.g., capacitors, resistors, etc.) therein. In some embodiments, mechanical or optical elements (e.g., an optical cover) may be disposed over one or both of the first and second substrates 110, 120. The formed conductive column 130 can be used to perform electrical functions (e.g., carry signals or a reference potential), mechanical functions (e.g., absorb mechanical stress between the first and second substrates) and/or thermal functions (e.g., heat transfer purposes).

Figure 3:
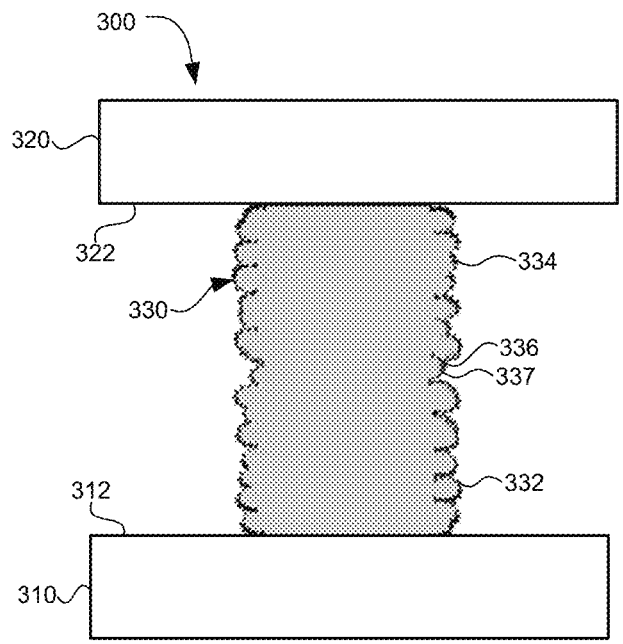
FIG. 3 is a diagrammatic side sectional view of an assembly according to an alternative embodiment of the assembly shown in FIG. 1.

FIG. 3 shows an assembly 300 that is a variation of the assembly 100 shown and described above with reference to FIG. 1. The assembly 300 is the same as the assembly 100 described above, except that the conductive column 330 has one or more scalloped or jagged sidewall surfaces 337 throughout the height of the column, showing structural evidence of nanoparticles deposited thereon, rather than having a scalloped or jagged sidewall surface located only in or adjacent the bond region 336. Also, as will be described below with reference to FIGS. 4B and 4C, the nanoparticles 350 are deposited onto the first and second portions 332, 334 by electroless or electrolytic deposition.

Figure 4A:
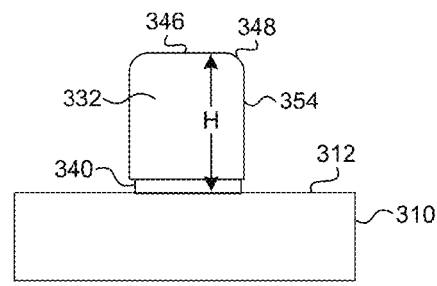
FIGS. 4A-4C are side sectional views illustrating stages of fabrication in accordance with the embodiment depicted in FIG. 3.
Figure 4B:
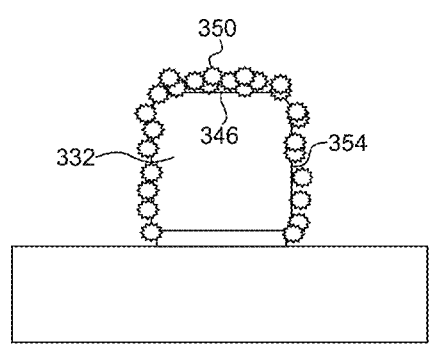
Figure 4C:
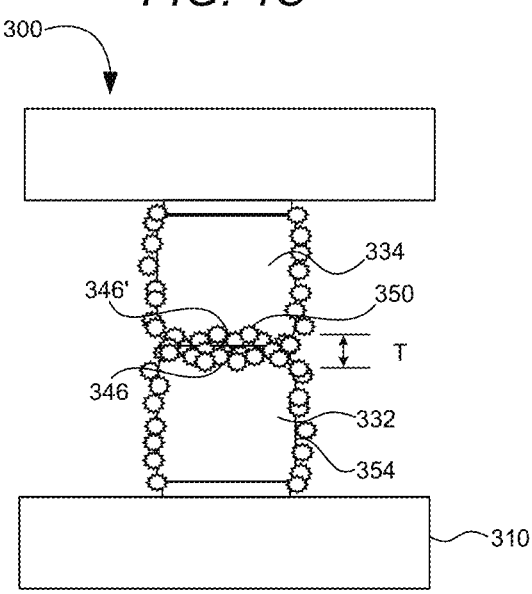

In the embodiment shown in FIGS. 3 through 4C, the nanoparticles 350 are deposited along portions of or the entire sidewalls 354 of the first and second portions 332, 334. Furthermore, the jagged surface 337 formed at the bond region 336 and at the sidewalls 354 may have a surface roughness that is greater than 30 nanometers.

A method of fabricating the assembly 300 (FIG. 3) will now be described, with reference to FIGS. 4A-4C. The method of fabricating the assembly 300 may begin in the same way as the method steps described above with reference to FIGS. 2A-2C. Next, referring to FIG. 4A, after the first portion 332 is formed, the photoresist layer 142 (FIG. 2C) may be removed.

Then, the seed layer 340 may be removed at locations along the major surface 312 of the first substrate 310 where it is not desired to have conductive material (e.g., between adjacent ones of the first portions 332). The portions of the seed layer 340 that are not removed may form part of the conductive column 330 that extends between the major surfaces 312 and 322.

Next, as shown in FIG. 4B, nanoparticles 350 are deposited onto the top surface 346 and sidewalls 354 of the first portion 332. In one example, the nanoparticles 350 can completely or substantially completely cover the top surface 346 and the edge surfaces or sidewalls 354 of the first portion 332. In this embodiment, the first portion 332 can be a unitary substantially rigid metal post or conductive pad or conductive trace, and the top surface 346 can project a height H (FIG. 4A) above the major surface 312 such that the top surface is remote from the major surface. The first portion 332 can define edge surfaces or sidewalls 354 extending at substantial angles away from the top surface 346.

In this example, the nanoparticles 350 are deposited by electroless or electrolytic deposition, in which the first portion 332 is exposed to an electroless or electrolytic plating bath to deposit the nanoparticles 350. The electroless deposition bath used to deposit the nanoparticles 350 onto the top surfaces 346 and sidewalls 354 of the first portion 332 may be the same bath or a different bath than the one that is used to deposit the metal of the first portion 332 onto the seed layer 340.

Then, as shown in FIG. 4C, the first portion 332 extending from the major surface 312 of the first substrate 310 may be joined with the second portion 334 extending from the major surface 322 of the second substrate 320. The second portion 334 may be formed using the same method steps shown and described with reference to FIGS. 4A and 4B including application of the nanoparticles 350 thereon, or alternatively, the nanoparticles may be applied only to one of the first and second portions 332, 334 and not to the other portion.

To join the first portion 332 and the second portion 334 with one another, at least interfaces of the juxtaposed first and second portions of the assembly 300 may be heated to a temperature that is close to the joining or sintering temperature. Then, the first portion 332 and the second portion 334 are juxtaposed with one another, and the first and second portions can be aligned with one another in the first and second lateral directions.

Next, the first portion 332 and the second portion 334 can be brought into contact with one another, such that the nanoparticles 350 that were applied to one or both of the top surfaces 346, 346' of the respective first and second portions can then join together to form a layer having a thickness T in the third direction D3 by up to 3 microns, or between 0.02 microns and 3 microns, or between 0.05 and 3 microns, for example. Therefore, the nanoparticles 350 can compensate for gaps between confronting corresponding top surfaces 346, 346' of the respective first and second portions 332, 334.

Then, at least interfaces of the juxtaposed first and second portions 332, 334 can be heated to a joining or sintering temperature, which preferably is below 200° C., more preferably below 180° C., or still more preferably below 150° C., at a relatively low pressure. During joining of the juxtaposed first and second portions 332, 334, an initial joining temperature can be below 100° C. before further heat processing at higher temperatures. At the joining temperature and sufficient pressure, the nanoparticles 350 may diffuse into both the first portion 332 and the second portion 334, thereby forming a metallurgical joint and joining the first and second portions together into a conductive column 330, as can be seen in FIG. 3.

Figure 6A:
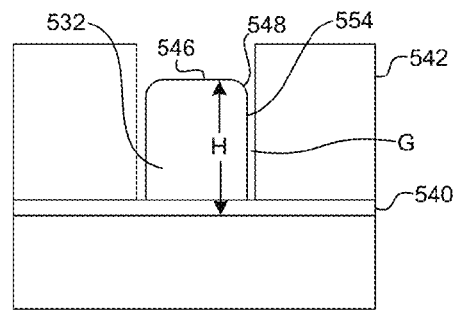
FIGS. 6A-6D are side sectional views illustrating stages of fabrication in accordance with the embodiment depicted in FIG. 5.

In a variation of a portion of the process described above with respect to FIGS. 4A and 4B, after the formation of the first portion 332, the photoresist layer 142 (FIG. 2C) may remain in place, rather than being removed. In such embodiments, portions of the first portion 332 or the photoresist layer 142 may be slightly etched or removed to form a small gap between sidewalls 354 of the first portion and the photoresist layer (e.g., such as the gap G shown in FIG. 6A). After the gap-formation step, the nanoparticles 350 can be deposited onto the top surface 346 and sidewalls 354 of the first portion 332 by the electroless or electrolytic methods described earlier. After the nanoparticles 350 are deposited, a mask (e.g., a mask such as a photoresist layer) may be deposited over the nanoparticles, and the photoresist layer 142 and portions of the seed layer 340 may be removed, thereby producing the structure shown in FIG. 4B.

In this embodiment having nanoparticles 350 deposited onto the top surfaces 346, 346' and edge surfaces or sidewalls 354 of the first and second portions 332, 334, it may be easier for the edge surfaces of the first and second portions to be joined to one another, or an edge surface of one of the first and second portions to be joined with a top surface of another one of the first and second portions. Thus, having nanoparticles 350 deposited onto the top surfaces 346, 346' edge surfaces or sidewalls 354 of the first and second portions 332, 334 may permit the corresponding first and second portions to be more misaligned with one another during the joining process than in embodiments without nanoparticles deposited onto the sidewalls of the first and second portions, since joints may be formed between edge surfaces of the first and second portions, or an edge surface of one of the first and second portions and a top surface of another one of the first and second portions.

Figure 5:
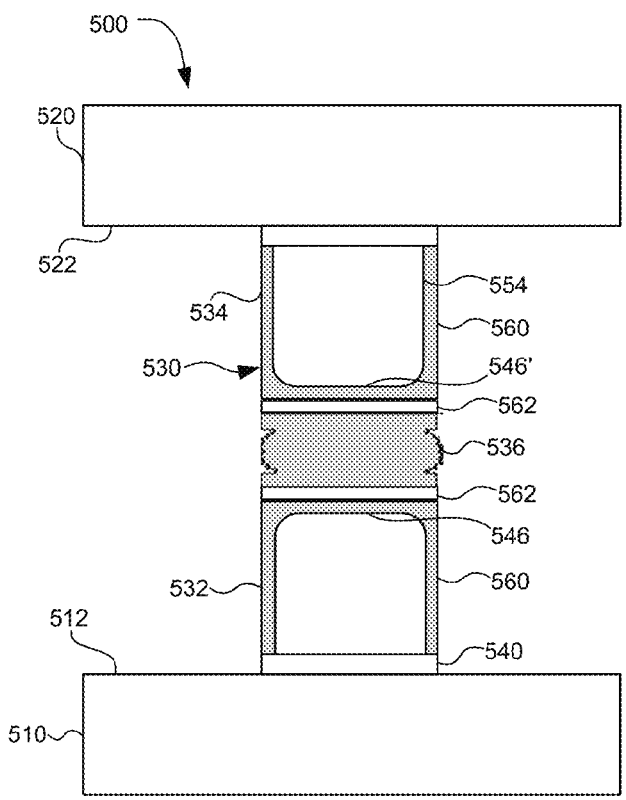
FIG. 5 is a diagrammatic side sectional view of an assembly according to another alternative embodiment of the assembly shown in FIG. 1.

FIG. 5 shows an assembly 500 that is a variation of the assembly 100 shown and described above with reference to FIG. 1. The assembly 500 is the same as the assembly 100 described above, except that an adhesion layer and/or a barrier layer 560 is deposited over the top surface 546, 546' and the sidewalls 554 of the first and second portions 532, 534, and a bond layer 562 and a wetting layer 564 are deposited overlying the top surface of the first and second portions before the nanoparticles 550 are deposited. The barrier layer 560 can have a thickness of less than 100 nanometers, for example.

In this embodiment, the nanoparticles 550 can comprise solder, so that bonding of the first and second portions 532, 534 can occur at a very low temperatures, for example, less than 120° C., and at a relatively low pressure. The use of solder as the nanoparticles 550 can permit rework of the assembly 500. For example, if the assembly 500 is heated above 120° C., the solder may sinter sufficiently to allow the first and second portions 532, 534 to be separated from one another, while the metal of the first and second portions, and the metal of the barrier layer 560 and the bond layer 562 may remain solid. New nanoparticles 550 can then be applied to the first and second portions 532, 534, and the first and second portions can be rejoined.

A method of fabricating the assembly 500 (FIG. 5) will now be described, with reference to FIGS. 6A-6D. The method of fabricating the assembly 500 may begin in the same way as the method steps described above with reference to FIGS. 2A and 2B. Next, referring to FIG. 6A, the first portion 532 or a portion of the mask or photoresist layer 542 can be partially etched, defining a top surface 546 generally facing in the third direction (FIG. 1) that may have a rounded peripheral edge 548.

The etching of the first portion 532 may also proceed along the sidewalls 554 from the top surface 546 to the seed layer 540, defining a gap G between the sidewalls and the photoresist layer 542. In one example, the gap G may extend along the entire height of the sidewalls 554, exposing a portion of the seed layer 540 within the gap. In another example, the gap G may extend along only a portion of the height of the sidewalls 554, not extending down to the seed layer 540. In yet another example, the gap G may extend along the entire height of the sidewalls 554 and partially or entirely through the seed layer 540. In this embodiment, the first portion 532 can be a unitary substantially rigid metal post or conductive pad or conductive trace, and the top surface 546 can project a height H above the major surface 512 such that the top surface is remote from the major surface. The first portion 532 can define edge surfaces or sidewalls 554 extending at substantial angles away from the top surface 546.

Figure 6B:
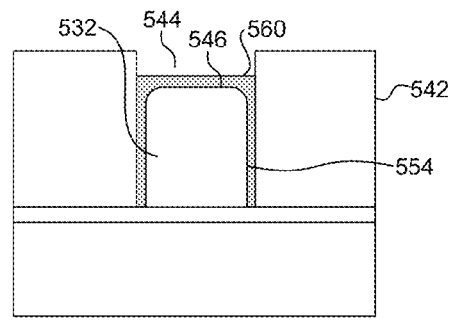

Then, as shown in FIG. 6B, a barrier layer 560 is deposited within the opening 544 of the photoresist layer 542, over the top surface 546 and the sidewalls 554 of the first portion 532. In one example, the barrier layer 560 can completely cover the top surface 546 and the edge surfaces or sidewalls 554 of the first portion 532.

Examples of metals that can be suitable for use in the barrier layer 560 can include nickel, tungsten, titanium nitride, tantalum nitride, tantalum silicon nitride, tantalum, tungsten silicon nitride, an alloy including nickel, and combinations thereof. The barrier layer 560 can prevent metal from the nanoparticles 550 (e.g., solder) from diffusing into the metal material of the first portion 532 (e.g., copper).

Figure 6C:
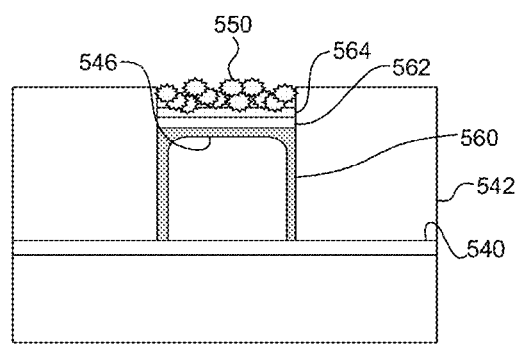

Next, referring to FIG. 6C, a bond layer 562 and a wetting layer 564 can be deposited overlying the top surface 546 of the first portion 532. The bond layer 562 can be deposited onto a surface of the barrier layer 560. The bond layer 562 can comprise gold, for example. The wetting layer 564 can be deposited overlying the bond layer 562. The wetting layer can comprise solder, for example. In some examples, the bond layer 562 and the wetting layer 564 can be the same material, or can comprise similar materials or alloys of similar materials.

Then, nanoparticles 550 are deposited onto the wetting layer 564. In this example, the nanoparticles 550 are deposited by electrolytic deposition, in which the first portion 532 is exposed to an electrolytic bath at a current density greater than 50 mA/cm$^2$, so as to cause depletion of the plating bath. As described above, the nanoparticles 550 may comprise solder or one or more bond metals such as tin, indium, bismuth, or a combination of two or more of such bond metals.

Next, the photoresist layer 542 may be removed, and then a dielectric protective mask may then be selectively deposited over the first portion 532, to protect the nanoparticles and the first portions during removal of portions of the seed layer 540, as shown an described above with reference to FIG. 2E. Then, the seed layer 540 may be removed at locations along the major surface 512 of the first substrate 510 where it is not desired to have conductive material (e.g., between adjacent ones of the first portions 532). After the excess portions of the seed layer 540 are removed, the protective mask may be removed.

Figure 6D:
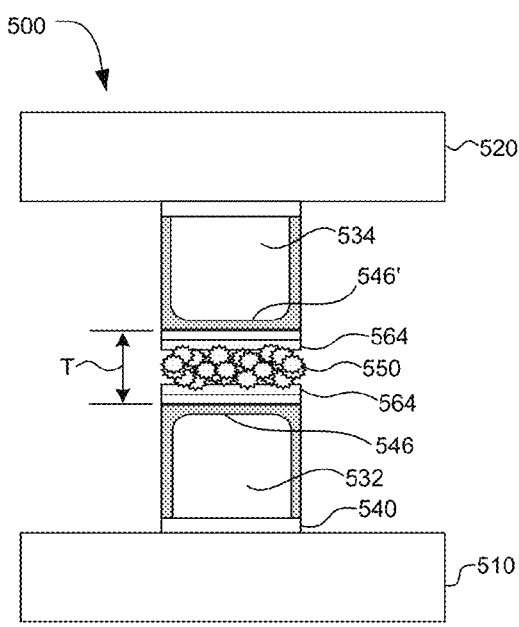

Then, as shown in FIG. 6D, the first portion 532 extending from the major surface 512 of the first substrate 510 may be joined with the second portion 534 extending from the major surface 522 of the second substrate 520. The second portion 534 may be formed using the same method steps shown and described with reference to FIGS. 6A-6C including application of the nanoparticles 550 thereon, or alternatively, the nanoparticles may be applied only to one of the first and second portions 532, 534 and not to the other portion.

To join the first portion 532 and the second portion 534 with one another, at least interfaces of the juxtaposed first and second portions of the assembly 500 may be heated to a temperature that is close to the joining or sintering temperature. Then, the first portion 532 and the second portion 534 are juxtaposed with one another, and the first and second portions can be aligned with one another in the first and second lateral directions.

Next, the first portion 532 and the second portion 534 can be brought into contact with one another, such that the nanoparticles 550 that were applied to one or both of the top surfaces 546, 546' of the respective first and second portions can then join together to form a layer having a thickness T in the third direction D3 by up to 3 microns, or between 0.5 microns and 3 microns, for example. Therefore, the nanoparticles 550 can compensate for gaps between confronting corresponding top surfaces 546, 546' of the respective first and second portions 532, 534.

Then, at least interfaces of the juxtaposed first and second portions 532, 534 can be heated to a joining or sintering temperature, which preferably is below 120° C., at a relatively low pressure. At the joining temperature and sufficient pressure, the nanoparticles 550 may diffuse into the wetting layers 564 of both the first portion 532 and the second portion 534, thereby forming a bond region 536 from the nanoparticles and the wetting layers, and forming a metallurgical joint and joining the first and second portions together into a conductive column 530, as can be seen in FIG. 5. In one example, the bond region 536 can be located between the barrier layer 560 of the first portion 532 and the top surface 546' of the corresponding second portion 534.

FIG. 7 shows an assembly 700 that is a variation of the assembly 500 shown and described above with reference to FIG. 5. The assembly 700 is the same as the assembly 500 described above, except the bond layer is omitted, and the wetting layer 764 is deposited directly onto the barrier layer 760 before the nanoparticles 750 are deposited. In this embodiment, the wetting layer 764 and the nanoparticles 750 can each comprise gold, for example.

A method of fabricating the assembly 700 (FIG. 7) will now be described, with reference to FIGS. 8A and 8B. The method of fabricating the assembly 700 may begin in the same way as the method steps described above with reference to FIGS. 2A, 2B, 6A, and 6B. Next, referring to FIG. 8A, a wetting layer 764 can be deposited overlying the top surface 746 of the first portion 732. The wetting layer 564 can be deposited overlying the bond layer 562. The wetting layer can comprise gold and/or palladium, for example.

Then, nanoparticles 750 are deposited onto the wetting layer 764. In this example, the nanoparticles 750 are deposited by electrolytic deposition, in which the first portion 732 is exposed to an electrolytic bath at a current density greater than 50 mA/cm$^2$, so as to cause depletion of the plating bath. As described above, the nanoparticles 750 may comprise gold.

Next, the photoresist layer 742 may be removed, and then a dielectric protective mask may then be selectively deposited over the first portion 732, as described above with reference to FIG. 2E. Then, the seed layer 740 may be removed at locations along the major surface 712 of the first substrate 710 where it is not desired to have conductive material (e.g., between adjacent ones of the first portions 732). After the excess portions of the seed layer 740 are removed, the protective mask may be removed.

Then, as shown in FIG. 8B, the first portion 732 extending from the major surface 712 of the first substrate 710 may be joined with the second portion 734 extending from the major surface 722 of the second substrate 720. The second portion 734 may be formed using the same method steps shown and described with reference to FIGS. 2A, 2B, 6A, 6B, and 8A including application of the nanoparticles 750 thereon, or alternatively, the nanoparticles may be applied only to one of the first and second portions 732, 734 and not to the other portion.

To join the first portion 732 and the second portion 734 with one another, at least interfaces of the juxtaposed first and second portions of the assembly 700 may be heated to a temperature that is close to the joining or sintering temperature. Then, the first portion 732 and the second portion 734 are juxtaposed with one another, and the first and second portions can be aligned with one another in the first and second lateral directions.

Next, the first portion 732 and the second portion 734 can be brought into contact with one another, such that the nanoparticles 750 that were applied to one or both of the top surfaces 746, 746' of the respective first and second portions can then join together to form a layer having a thickness T in the third direction D3 by up to 3 microns, or between 0.5 microns and 3 microns, for example. Therefore, the nanoparticles 750 can compensate for gaps between confronting corresponding top surfaces 746, 746' of the respective first and second portions 732, 734.

Then, at least interfaces of the juxtaposed first and second portions 732, 734 can be heated to a joining or sintering temperature, which preferably is below 200° C., more preferably below 180° C., or still more preferably below 150° C., at a relatively low pressure. During joining of the juxtaposed first and second portions 732, 734, an initial joining temperature can be below 100° C. before further heat processing at higher temperatures. At the joining temperature and sufficient pressure, the nanoparticles 750 may diffuse into the wetting layers 764 of both the first portion 732 and the second portion 734, thereby forming a bond region 736 from the nanoparticles and the wetting layers, and forming a metallurgical joint and joining the first and second portions together into a conductive column 730, as can be seen in FIG. 7. In one example, the bond region 736 can be located between the barrier layer 760 of the first portion 732 and the top surface 746' of the corresponding second portion 734.

The assemblies 100, 300, 500, and 700 described herein can have some potential advantages compared to conventional assemblies. The nanoparticle layers described herein can compensate for a significant degree of non-planarity of the confronting top surfaces of the first and second conductive portions of the respective first and second substrates. For example, as described above, the layer of nanoparticles 150 can be compressed by different distances among different ones of the juxtaposed first and second portions, due to the non-planarity among the top surfaces of the first and second portions, so that the thickness of the resulting bond region 136 can vary by up to 3 microns so as to accommodate the non-coplanarity of the juxtaposed top surfaces of at least some of the first and second portions 132, 134. Such an ability to compensate for non-planarity of the confronting top surfaces may permit less expensive conductive element forming processes to be used that have a larger degree of non-planarity of the first and second conductive portions.

Another potential advantage of the assemblies 100, 300, 500, and 700 described herein compared to conventional assemblies may be that the lower degree of warpage described above when joining first and second substrates as described herein with nanoparticles having a low joining or sintering temperature (e.g., below 200° C.) may permit use of first and second conductive portions with a smaller top surface area. Therefore, such first and second conductive portions with a smaller top surface area can form conductive columns that are thinner and more flexible, so assemblies having such thinner conductive columns can have better long-term reliability of the electrical connections between the first and second substrates after many repetitions of thermal cycling due to use of the assemblies over time.

Although the embodiments of FIGS. 1, 3, 5, and 7 were shown and described as having first and second conductive portions 132/332/532/732 and 134/334/534/734 that each are a unitary substantially rigid metal post defining a top surface and edge surfaces or sidewalls extending at substantial angles away from the top surface, that need not be the case.

In some examples, in any of the embodiments described above, either or both of the first and second conductive portions 132/332/532/732 and 134/334/534/734 can be a thin, thin, flat pad of metal, or a metal trace, comprising a material such as copper, aluminum, gold, nickel, or tungsten, deposited with a bottom surface thereof facing the major surface of the respective first or second substrate, or either or both of the first and second conductive portions 132/332/532/732 and 134/334/534/734 can be deposited into a recess extending below the major surface of the respective first or second substrate, and the nanoparticles 150/350/550/750 can be deposited onto a top surface facing away from the respective major surface. For example, referring to FIG. 1, the first conductive portion 132 can be in the form of the first conductive element 131, and the nanoparticles 150 can be deposited directly onto a top surface of the first conductive element, and/or the second conductive portion 134 can be in the form of the second conductive element 133, and the nanoparticles can be deposited directly onto a top surface of the second conductive element.

Although the method steps of FIGS. 2A-2F, FIGS. 4A-4C, 6A-6D, and 8A-8B were described above with reference to forming a single conductive column 130/330/530/730 from a single first portion 132/332/532/732 and a single second portion 134/334/534/734, it is to be understood that the method steps described above can also be used to form a plurality of conductive columns or an m×n array of conductive columns from a plurality or an array of first portions extending from a single first substrate 110/310/510/710 and a plurality or an array of corresponding second portions extending from a single second substrate 120/320/520/720, one or both of m and n being greater than one.

The method steps of FIGS. 2A-2F, FIGS. 4A-4C, 6A-6D, and 8A-8B described above can also be used to form pluralities or arrays of conductive columns 130/330/530/730 on a plurality of sets of corresponding first and second substrates 110/310/510/710, 120/320/520/720, where the first substrates are initially part of a single first wafer, and the second substrates are initially part of a single second wafer, and the joined first and second wafers can be diced into individual assemblies 100/300/500/700 after joining of the corresponding first and second portions 132/332/532/732, 134/334/534/734.

For example, in one embodiment, a plurality of the first substrates are initially part of a single microelectronic element wafer including a plurality of microelectronic element portions, each microelectronic element portion including a respective subset of the first conductive portions at the respective major surface, and a plurality of the second substrates are initially part of a single substrate panel including a plurality of substrate portions, each substrate portion including a respective subset of the second conductive portions at the respective major surface.

Although the embodiments of FIGS. 1, 3, 5, and 7 were shown and described as having first and second conductive portions 132/332/532/732 and 134/334/534/734 that each are a unitary substantially rigid metal post extending away from the respective major surface 112/312/512/712 and 122/322/522/722, that need not be the case. In some embodiments, the first portions 132/332/532/732 and/or the second portions 134/334/534/734 can be a conductive layer or region conformally or non-conformally deposited into a recess (not shown) extending below the respective major surface 112/312/512/712 and/or 122/322/522/722, and the first and/or second conductive portions 132/332/532/732 and 134/334/534/734 may or may not fill its respective recess. The nanoparticles 150/350/550/750 may be deposited onto an exposed surface of such a deposited layer or region. Similar to the embodiment of FIGS. 5 through 6D, an adhesion layer and/or a barrier layer can be deposited onto such a deposited layer or region, and the nanoparticles 150/350/550/750 can be deposited onto the adhesion layer and/or the barrier layer.

In a particular example where the first portions 132/332/532/732 and the second portions 134/334/534/734 are deposited into a recess extending below the respective major surface 112/312/512/712 and/or 122/322/522/722, the first and second portions can each extend to approximately the plane of the respective major surface, and the nanoparticles 150/350/550/750 can be deposited onto a top surface of the first portion and/or second portion. In such an example, when the first and second substrates 110/310/510/710, 120/320/520/720 are joined together by the nanoparticles, the major surfaces 112/312/512/712 and 122/322/522/722 may be touching each other or almost touching each other.

In this example, given the close spacing of the major surfaces 112/312/512/712 and 122/322/522/722 from one another, it may not be possible to deposit underfill between adjacent ones of the joined conductive columns 130/330/530/730. Underfill may not be needed in such an example, because the joined first portions 132/332/532/732 and the second portions 134/334/534/734 and the major surfaces 112/312/512/712 and 122/322/522/722 that may be touching each other can provide sufficient structural integrity of the joined assembly without using underfill.

Underfill may not be need in regions where the local area density of the conductive columns 130/330/530/730 is at least 30%, which means that in a given plane extending through the conductive columns and parallel to the major surfaces 112/312/512/712 and 122/322/522/722, at least 30% of the planar area is occupied by the conductive columns. If the local area density of the conductive columns is at least 30%, the conductive columns can provide sufficient structural integrity to the joined assembly so that underfill is not needed. In one example, underfill may not be needed where the local area density of the conductive columns is at least 50%.

In such an embodiment not having underfill between adjacent ones of the conductive columns, the first and second substrates 110/310/510/710, 120/320/520/720 can be sealed together with an overmold compound, and/or an outer peripheral boundary of the region having the joined conductive columns 130/330/530/730 can be sealed with a sealant such as a dielectric material like parylene or silicon dioxide, or with underfill, to keep moisture out of the region having the joined conductive columns. However, such a sealant may only need to be applied around an outer peripheral boundary of the region having the joined conductive columns 130/330/530/730, such that the sealant does not extend between adjacent ones of the joined conductive columns 130/330/530/730.

Such an assembly of the first and second substrates 110/310/510/710, 120/320/520/720 that is joined together without underfill between adjacent ones of the joined conductive columns 130/330/530/730 can be more resistant to warping than it would be if underfill was used. Underfill may have a relatively high CTE (e.g., 15-25 ppm/° C.) compared to the material of the substrates 110/310/510/710, 120/320/520/720, so the use of underfill may warp the substrates when they undergo differential thermal expansion due to a temperature change. Without using underfill between adjacent ones of the joined conductive columns 130/330/530/730, the joined assembly can be flatter and have a lower risk of warpage due to differential thermal expansion. This type of joining structure without underfill may, for example, be used for chip-to-wafer or wafer-to-wafer bonding.

The assemblies described above with reference to FIGS. 1 through 8B above can be utilized in construction of diverse electronic systems, such as the system 900 shown in FIG. 9. For example, the system 900 in accordance with a further embodiment of the invention includes a plurality of modules or components 906 such as the assemblies as described above, in conjunction with other electronic components 908, 910 and 911.

In the exemplary system 900 shown, the system can include a circuit panel, motherboard, or riser panel 902 such as a flexible printed circuit board, and the circuit panel can include numerous conductors 904, of which only one is depicted in FIG. 9, interconnecting the modules or components 906, 908, 910 with one another. Such a circuit panel 902 can transport signals to and from each of the microelectronic packages and/or microelectronic assemblies included in the system 900. However, this is merely exemplary; any suitable structure for making electrical connections between the modules or components 906 can be used.

In a particular embodiment, the system 900 can also include a processor such as the semiconductor chip 908, such that each module or component 906 can be configured to transfer a number N of data bits in parallel in a clock cycle, and the processor can be configured to transfer a number M of data bits in parallel in a clock cycle, M being greater than or equal to N.

In the example depicted in FIG. 9, the component 908 is a semiconductor chip and component 910 is a display screen, but any other components can be used in the system 900. Of course, although only two additional components 908 and 911 are depicted in FIG. 9 for clarity of illustration, the system 900 can include any number of such components.

Modules or components 906 and components 908 and 911 can be mounted in a common housing 901, schematically depicted in broken lines, and can be electrically interconnected with one another as necessary to form the desired circuit. The housing 901 is depicted as a portable housing of the type usable, for example, in a cellular telephone or personal digital assistant, and screen 910 can be exposed at the surface of the housing. In embodiments where a structure 906 includes a light-sensitive element such as an imaging chip, a lens 911 or other optical device also can be provided for routing light to the structure. Again, the simplified system shown in FIG. 9 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of making an assembly, comprising:
   forming a first conductive element at a first surface of a substrate of a first component, the first conductive element extending in a direction away from the first surface;
   forming conductive nanoparticles at a surface of the conductive element by exposure to an electroless plating bath, the conductive nanoparticles having long dimensions smaller than 100 nanometers;

juxtaposing the surface of the first conductive element with a corresponding surface of a second conductive element at a major surface of a substrate of a second component, with the conductive nanoparticles disposed in a bond region between the surfaces of the first and second conductive elements; and elevating a temperature at least at interfaces of the juxtaposed first and second conductive elements to a joining temperature at which the conductive nanoparticles cause metallurgical joints to form between the juxtaposed first and second conductive elements, wherein the first conductive element is one of a plurality of first conductive elements at the first surface, and the second conductive element is one of a plurality of second conductive elements at the major surface, corresponding surfaces of the first and second conductive elements being juxtaposed with one another, and wherein the juxtaposing step includes compressing thicknesses of the bond regions by different distances among different ones of the juxtaposed first and second conductive elements, the thickness of the bond region varying among the different ones of the juxtaposed first and second conductive elements by up to 3 microns so as to accommodate non-coplanarity of the top surfaces of at least some of the first conductive elements.

2. The method of claim 1, wherein the first conductive element is a substantially rigid post, the direction is a vertical direction, and the surface of the first conductive element is a top surface that projects a height above the first surface of the first component such that the top surface is remote from the first surface, the post having edge surfaces extending substantially in the vertical direction away from the top surface, and wherein the forming of the conductive nanoparticles deposits the conductive nanoparticles onto the edge surfaces of the post, the nanoparticles substantially completely covering the top surface and the edge surfaces of the post.

3. The method of claim 1, wherein, after the elevating temperature step, the interface of the juxtaposed first and second conductive elements contains microvoids, each microvoid having a maximum width below 0.5 microns.

4. The method of claim 1, wherein at least one of the first or second components is a microelectronic element including active semiconductor devices, and the joining temperature is not more than 150° C.

5. The method of claim 1, wherein at least one of the first and second conductive elements comprises an electrically conductive pad or an electrically conductive trace.

6. A method of making an assembly, comprising:

forming conductive nanoparticles at a surface of a first conductive element at a first surface of a substrate of a first component by exposing the first conductive element to an electrolytic bath at a current density greater than the mass transport limiting current density of the plating bath, the conductive nanoparticles having long dimensions smaller than 100 nanometers;

juxtaposing the surface of the first conductive element with a corresponding surface of a second conductive element at a major surface of a substrate of a second component, with the conductive nanoparticles disposed in a bond region between the surfaces of the first and second conductive elements; and elevating a temperature at least at interfaces of the juxtaposed first and second conductive elements to a joining temperature at which the conductive nanoparticles cause metallurgical joints to form between the juxtaposed first and second conductive elements, wherein the first conductive element is one of a plurality of first conductive elements at the first surface, and the second conductive element is one of a plurality of second conductive elements at the major surface, corresponding surfaces of the first and second conductive elements being juxtaposed with one another, and wherein the juxtaposing step includes compressing thicknesses of the bond regions by different distances among different ones of the juxtaposed first and second conductive elements, the thickness of the bond region varying among the different ones of the juxtaposed first and second conductive elements by up to 3 microns so as to accommodate non-coplanarity of the top surfaces of at least some of the first conductive elements.

7. The method of claim 6, further comprising, before forming the conductive nanoparticles, forming the plurality of first conductive elements by depositing a seed layer onto the first surface of the substrate of the first component and forming the first conductive elements extending from the seed layer.

8. The method of claim 7, further comprising, after forming the conductive nanoparticles, forming a dielectric mask covering the conductive nanoparticles and removing a portion of the seed layer from the first surface adjacent the first conductive element.

9. The method of claim 6, further comprising, before forming the conductive nanoparticles, forming the first conductive element on the first surface of a substrate of the first component, the first conductive element extending in a direction away from the first surface.

10. The method of claim 9, wherein the first conductive element is a substantially rigid post, the direction is a vertical direction, and the surface of the first conductive element is a top surface that projects a height above the first surface of the first component such that the top surface is remote from the first surface, the post having edge surfaces extending substantially in the vertical direction away from the top surface thereof.

11. The method of claim 10, wherein the second conductive element is a substantially rigid post, and the surface of the second conductive element is a top surface that projects a height above the major surface of the second component such that the top surface is remote from the major surface, the post of the second component having edge surfaces extending substantially in the vertical direction away from the top surface thereof.

12. The method of claim 6, wherein at least one of the first and second conductive elements comprises an electrically conductive pad or an electrically conductive trace.

* * * * *